United States Patent
Kurosawa

(10) Patent No.: US 6,709,543 B2
(45) Date of Patent: Mar. 23, 2004

(54) SEMICONDUCTOR CHIP PICKUP DEVICE AND PICKUP METHOD

(75) Inventor: Tetsuya Kurosawa, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 45 days.

(21) Appl. No.: 10/011,484

(22) Filed: Dec. 11, 2001

(65) Prior Publication Data

US 2002/0069952 A1 Jun. 13, 2002

(30) Foreign Application Priority Data

Dec. 11, 2000 (JP) .............................. 2000-376319

(51) Int. Cl.[7] .............................................. B32B 35/00
(52) U.S. Cl. .................... 156/344; 156/584; 438/464; 438/976; 29/426.6
(58) Field of Search .......................... 156/344, 584; 438/458, 464, 976; 29/426.1, 426.3, 426.5, 426.6

(56) References Cited

U.S. PATENT DOCUMENTS

| | | | | |
|---|---|---|---|---|
| 4,556,362 A | * | 12/1985 | Bahnck et al. | ........... 414/744.3 |
| 5,098,501 A | * | 3/1992 | Nishiguchi | .............. 156/275.5 |
| 2002/0019074 A1 | * | 2/2002 | Nakazawa et al. | ........... 438/107 |

FOREIGN PATENT DOCUMENTS

| | | | |
|---|---|---|---|
| JP | 2-39452 | * | 2/1990 |
| JP | 6-349934 | * | 12/1994 |
| JP | 7-335720 | | 12/1995 |
| JP | 10-189690 | | 7/1998 |
| JP | 11-297793 | | 10/1999 |
| JP | 2000-353710 | * | 12/2000 |

\* cited by examiner

*Primary Examiner*—Mark A. Osele
(74) *Attorney, Agent, or Firm*—Finnegan, Henderson, Farabow, Garrett, & Dunner, L.L.P.

(57) ABSTRACT

A semiconductor chip pickup jig which separates semiconductor chips affixed to an adhesive sheet from the adhesive sheet includes first and second thrust pin groups and a pin holder on which base portions of the first and second thrust pin groups are mounted. The thrust pins of the first thrust pin group are arranged in positions corresponding to corner portions of the semiconductor chip and thrust up the semiconductor chip by use of first front end portions thereof with the adhesive sheet disposed therebetween. The thrust pins of the second thrust pin group are arranged in positions corresponding to a nearby portion of a central portion of the semiconductor chip with second front end portions thereof being set lower than the first front end portions and thrust up the semiconductor chip by use of the second front end portions thereof with the adhesive sheet disposed therebetween.

51 Claims, 15 Drawing Sheets

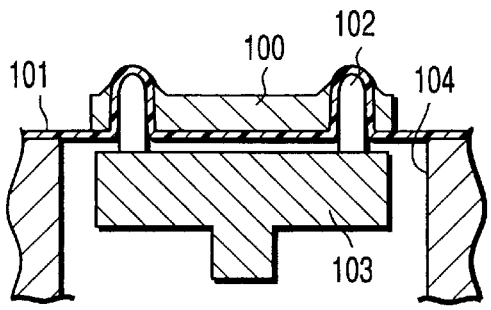
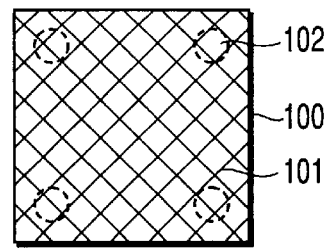
FIG. 6A
PRIOR ART
FIG. 6B
PRIOR ART
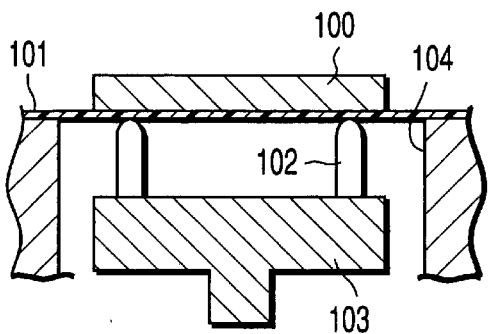
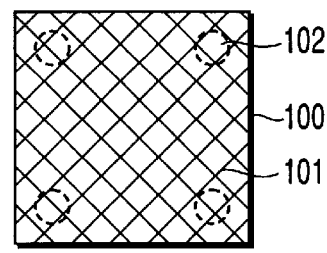
FIG. 7A
PRIOR ART
FIG. 7B
PRIOR ART
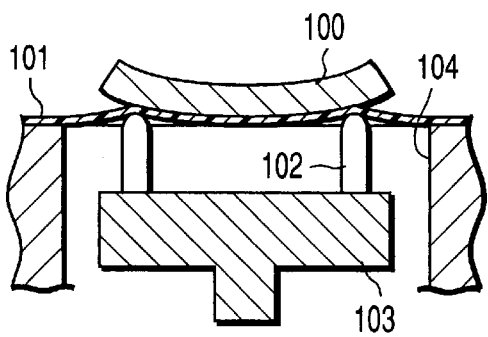
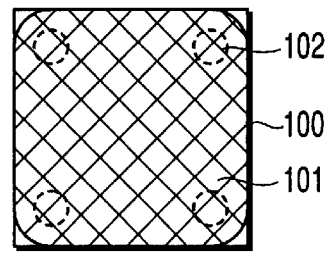
FIG. 8A
PRIOR ART
FIG. 8B
PRIOR ART

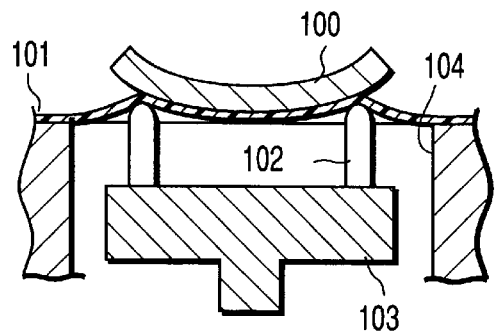 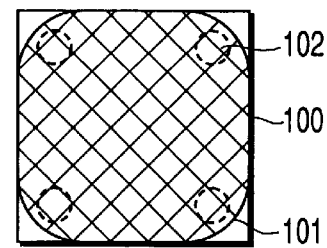
FIG. 9A PRIOR ART  FIG. 9B PRIOR ART
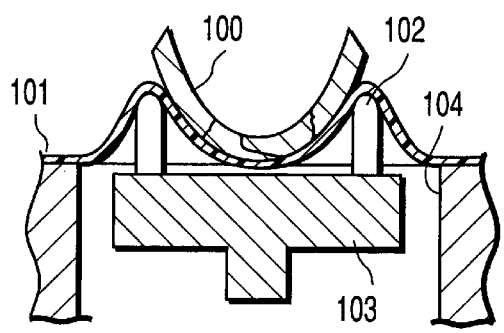 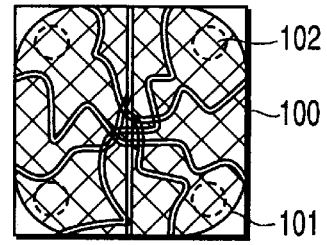
FIG. 10A PRIOR ART  FIG. 10B PRIOR ART

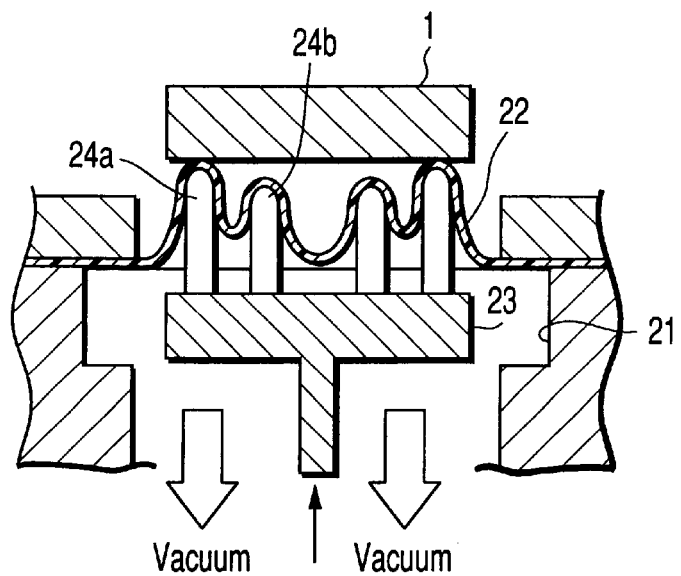
F I G. 12
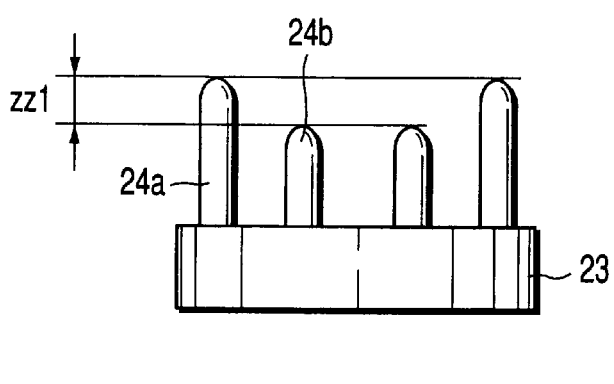
F I G. 13A
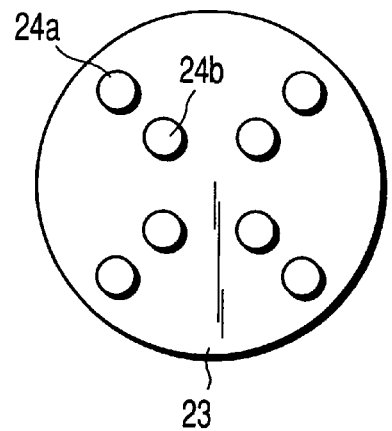
F I G. 13B

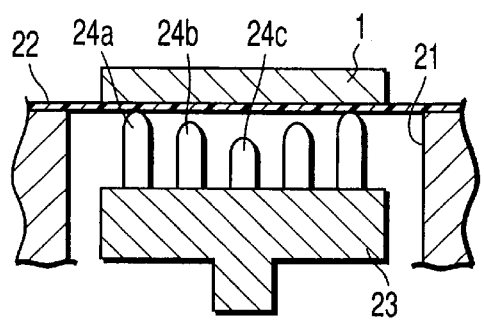
F I G. 18A
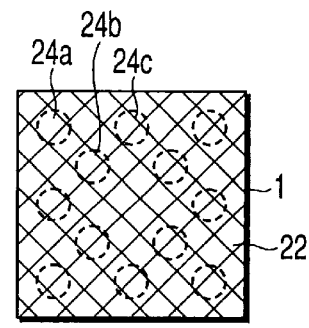
F I G. 18B
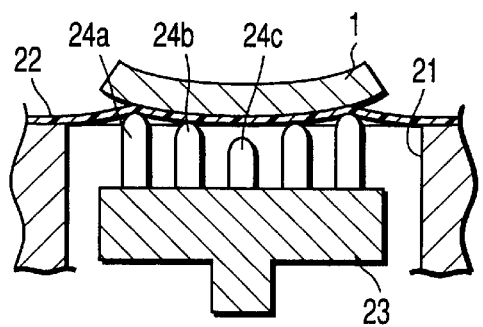
F I G. 19A
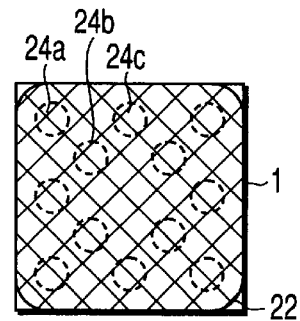
F I G. 19B
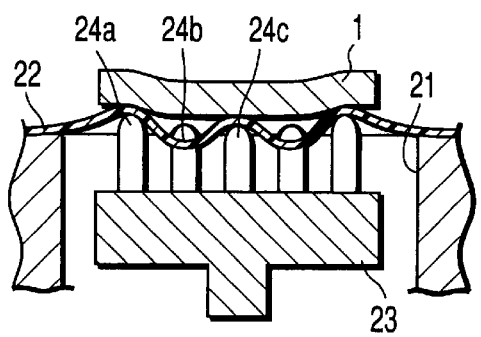
F I G. 20A
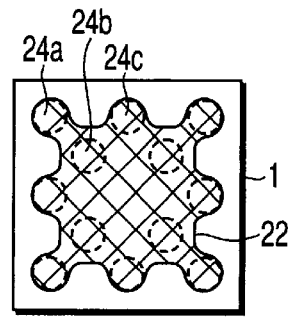
F I G. 20B

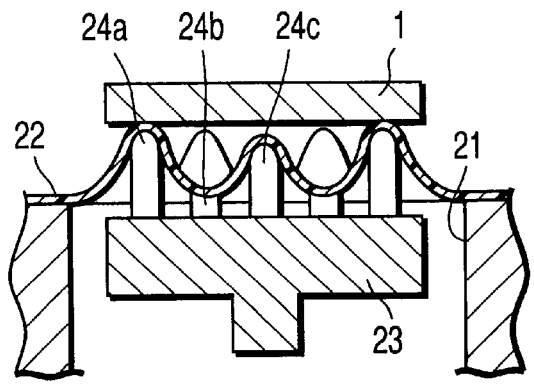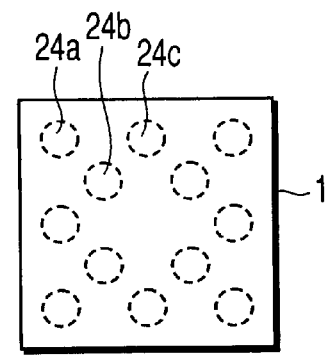
FIG. 29A            FIG. 29B
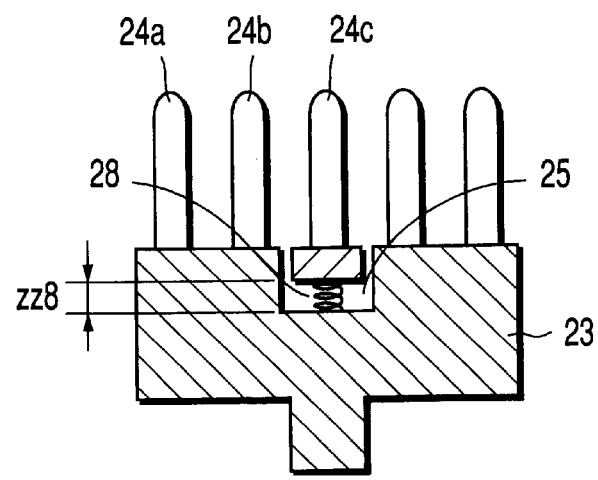
FIG. 30

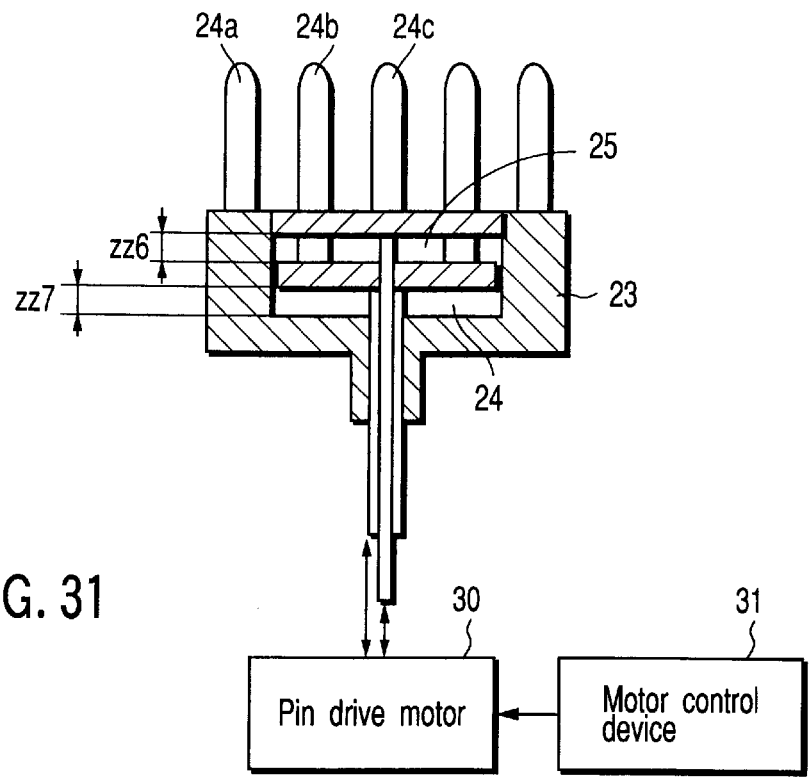
F I G. 31
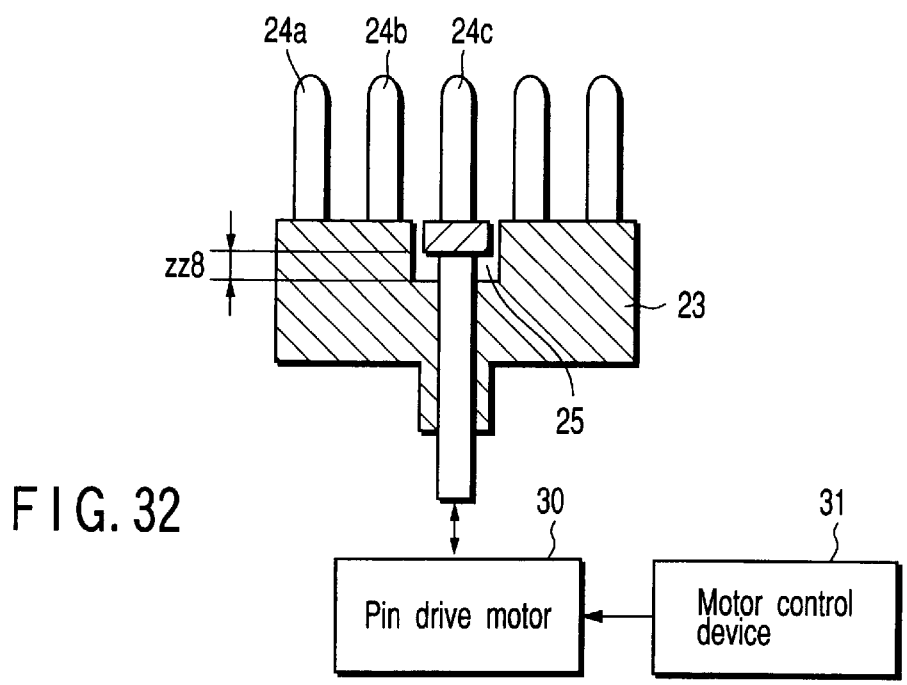
F I G. 32

SEMICONDUCTOR CHIP PICKUP DEVICE AND PICKUP METHOD

CROSS-REFERENCE TO RELATED APPLICATIONS

This application is based upon and claims the benefit of priority from the prior Japanese Patent Application No. 2000-376319, filed Dec. 11, 2000, the entire contents of which are incorporated herein by reference.

BACKGROUND OF THE INVENTION

1. Field of the Invention

This invention relates to a semiconductor chip pickup jig, a semiconductor chip pickup device and pickup method, and a semiconductor device manufacturing method and apparatus to which the above device and method are applied. More specifically, this invention is generally applied to an apparatus and method which picks up (separates) a plurality of semiconductor chips having a thickness of 100 μm or less from an adhesive sheet after the semiconductor chips are adhered to the adhesive sheet.

2. Description of the Related Art

Generally, a semiconductor wafer on which elements have been formed is individually separated and divided along dicing lines or chip division lines to form a plurality of semiconductor chips (dies or pellets). The semiconductor chips are adhered to an adhesive sheet (adhesive tape), each of the semiconductor chips is picked up from the adhesive sheet and the thus picked-up semiconductor chip is subjected to a mounting process for mounting the same on a lead frame or TAB tape, a mounting process for sealing the same into a package and the like so as to complete a semiconductor device.

FIG. 1 is a cross sectional view of an enlarged main constituting portion of the conventional pickup device which picks up semiconductor chips from an adhesive sheet. Further, FIGS. 2A and 2B are a side view and top view showing a semiconductor chip pickup jig (pin holder and thrust pins) used in the pickup device. When a semiconductor chip 100 is separated and picked up from an adhesive sheet 101, thrust pins (pickup needles) 102 are moved upwardly (raised) to press the rear surface of the semiconductor chip, push up the semiconductor chip 100 with the adhesive sheet 101 disposed therebetween and separate the semiconductor chip 100 from the adhesive sheet 101. The thrust pins 102 are arranged in positions corresponding to the corner portions of the semiconductor chip 100 or in positions corresponding to a portion near the central portion thereof and the base portions thereof are mounted on the pin holder 103.

According to a general order of the steps of separating the semiconductor chip 100, first, a fixing table on which the adhesive sheet 101 having the semiconductor chips 100 adhered thereto is fixed is moved so as to place one of the semiconductor chips 100 to be picked up above the thrust pins 102. Next, a mark detection process which is effected to detect the position of the semiconductor chip 100 to be separated and determine a good product or defective product of the semiconductor chip 100 is performed and the internal portion of a backup holder 104 is evacuated to hold and fix the adhesive sheet 101 by suction on the upper surface of the backup holder 104. In this state, the pin holder 103 on which the thrust pins 102 are attached is raised to project the thrust pins 102 from the upper surface of the backup holder 104 so as to press the rear surface of the semiconductor chip and push up the semiconductor chip 100 with the adhesive sheet 101 disposed therebetween. At this time, the front end portions of the thrust pins 102 mounted on the pin holder 103 are adjusted so as to be set at the same height.

In recent years, it is strongly required to make thin a semiconductor chip in order to contain the semiconductor chip into a card-form thin package, for example, and the rear surface of the semiconductor wafer is polished, ground and etched to reduce the thickness thereof to 100 μm or less. However, if the semiconductor chip is made thin to 100 μm or less, there occurs a problem that cracks occur when the semiconductor chip is separated from the adhesive sheet.

Next, a problem of the crack occurring when the semiconductor chip is made thin to 100 μm or less is explained in detail with reference to FIGS. 3A and 3B to FIGS. 6A and 6B and FIGS. 7A and 7B to FIGS. 10A and 10B. If the semiconductor chip is made extremely thin as described above, as shown in FIGS. 3A and 3B to FIGS. 6A and 6B, the thrust pins 102 will penetrate through a semiconductor chip 100 to cause chip cracks therein when the thrust pins 102 are raised to thrust and push up the rear surface of the semiconductor chip 100 with the adhesive sheet 101 disposed therebetween. If the thickness of the semiconductor chip 100 is 100 μm or more, the above phenomenon will not occur since the strength (in the thickness direction) of the semiconductor chip is high due to the adhesive strength between the semiconductor chip 100 and the adhesive sheet 101.

Further, as shown in FIGS. 7A and 7B to FIGS. 10A and 10B, even when outer peripheral portions (particularly, corner portions) of the semiconductor chip 100 are separated as shown in FIGS. 8A and 8B or FIGS. 9A and 9B, the semiconductor chip 100 is warped into a concave form before it is separated since the speed at which the adhesive sheet 101 is separated is lower than the rising speed of the thrust pins 102. As a result, as shown in FIGS. 10A and 10B, cracks finally occur. If the positions in which the thrust pins 102 are mounted on the pin holder 103 are set to correspond to a portion near the central portion of the semiconductor chip 100, it becomes difficult to separate the outer peripheral portions thereof from the adhesive sheet 101, the semiconductor chip 100 is warped into to a convex form and cracks will occur. Further, even if the number of thrust pins 102 is increased, it is difficult to suppress occurrence of cracks. In addition, it is also impossible to avoid occurrence of cracks even if a tape such as a UV tape having low adhesive strength of the adhesive sheet 101 is used.

Thus, if the thickness of the semiconductor chip is reduced, the strength of the semiconductor chip becomes weak and it is impossible to avoid occurrence of cracks if the conventional semiconductor chip pickup device and pickup method are used. The problem becomes more significant as the size of the semiconductor chip becomes larger. Therefore, it is desired to take measures against occurrence of cracks at the time of pickup.

BRIEF SUMMARY OF THE INVENTION

According to an aspect of the present invention, there is provided a semiconductor chip pickup jig which separates semiconductor chips removably affixed to an adhesive sheet from the adhesive sheet comprising a first group of thrust pins which are arranged in positions corresponding to corner portions of one of the semiconductor chips and thrust up the semiconductor chip by use of first front end portions thereof with the adhesive sheet disposed therebetween; a second group of thrust pins which are arranged in positions corresponding to a nearby portion of a central portion of the semiconductor chip with second front end portions thereof being set lower than the first front end portions of the first thrust pin group and thrust up the semiconductor chip by use of the second front end portions thereof with the adhesive sheet disposed therebetween; and a pin holder on which base portions of the first and second thrust pin groups are mounted.

According to another aspect of the present invention, there is provided a semiconductor chip pickup jig which separates semiconductor chips removably affixed to an adhesive sheet from the adhesive sheet comprising a first group of thrust pins which are arranged in positions corresponding to corner portions of one of the semiconductor chips and thrust up the semiconductor chip by use of first front end portions thereof with the adhesive sheet disposed therebetween; a second group of thrust pins which are arranged in positions corresponding to a nearby portion of a central portion of the semiconductor chip with second front end portions thereof being set at substantially the same height as the first front end portions of the first thrust pin group and thrust up the semiconductor chip by use of the second front end portions thereof with the adhesive sheet disposed therebetween; a third group of thrust pins which are arranged in positions corresponding to respective sides of the semiconductor chip and lying between the thrust pins of the first thrust pin group with third front end portions thereof being set lower than the first and second front end portions of the first and second thrust pin groups and thrust up the semiconductor chip by use of the third front end portions thereof with the adhesive sheet disposed therebetween; and a pin holder on which base portions of the first to third thrust pin groups are mounted.

According to still another aspect of the present invention, there is provided a semiconductor chip pickup jig which separates semiconductor chips removably affixed to an adhesive sheet from the adhesive sheet comprising a first group of thrust pins which are arranged in positions corresponding to corner portions of one the semiconductor chips and thrust up the semiconductor chip by use of first front end portions thereof with the adhesive sheet disposed therebetween; a second group of thrust pins which are arranged in positions corresponding to a nearby portion of a central portion of the semiconductor chip and thrust up the semiconductor chip by use of second front end portions thereof with the adhesive sheet disposed therebetween; a pin holder on which base portions of the first and second thrust pin groups are mounted; and a pin position controller which controls the second front end portions of the second thrust pin group to be set lower than the first front end portions of the first thrust pin group at the time of separation of the semiconductor chip.

According to another aspect of the present invention, there is provided a semiconductor chip pickup device which individually separates a plurality of semiconductor chips formed by discretely dividing a semiconductor wafer and removably affixed to a first surface of an adhesive sheet from the adhesive sheet comprising a fixing table on which the plurality of semiconductor chips are fixedly set with the semiconductor chips affixed to the adhesive sheet; a first group of thrust pins which are arranged in positions corresponding to corner portions of one of the semiconductor chips and thrust up the semiconductor chip by use of first front end portions thereof with the adhesive sheet disposed therebetween; a second group of thrust pins which are arranged in positions corresponding to a nearby portion of a central portion of the semiconductor chip with second front end portions thereof being set lower than the first front end portions of the first thrust pin group and thrust up the semiconductor chip by use of the second front end portions thereof with the adhesive sheet disposed therebetween; a pin holder on which base portions of the first and second thrust pin groups are mounted; a backup holder in which the pin holder having the first and second thrust pin groups mounted thereon is received and which is arranged on a second surface of the adhesive sheet opposite to the first surface; a moving mechanism which is constructed to relatively move the position of each semiconductor chip on the fixing table and the position of the backup holder; and a suction device which is constructed to fix the adhesive sheet to which the semiconductor chip to be picked up is affixed by drawing a vacuum on the inside of the backup holder; wherein the respective corner portions of the semiconductor chip are separated by use of the first thrust pin group and then the nearby portion of the central portion of the semiconductor chip is separated by use of the second thrust pin group.

According to another aspect of the present invention, there is provided a semiconductor chip pickup device which individually separates a plurality of semiconductor chips formed by discretely dividing a semiconductor wafer and removably affixed to a first surface of an adhesive sheet from the adhesive sheet comprising a fixing table on which the plurality of semiconductor chips are fixedly set with the semiconductor chips affixed to the adhesive sheet; a first group of thrust pins which are arranged in positions corresponding to corner portions of one of the semiconductor chips and thrust up the semiconductor chip by use of first front end portions thereof with the adhesive sheet disposed therebetween; a second group of thrust pins which are arranged in positions corresponding to a nearby portion of a central portion of the semiconductor chip with second front end portions thereof being set at substantially the same height as the first front end portions of the first thrust pin group and thrust up the semiconductor chip by use of the second front end portions thereof with the adhesive sheet disposed therebetween; a third group of thrust pins which are arranged in positions corresponding to respective sides of the semiconductor chip and lying between the thrust pins of the first thrust pin group with third front end portions thereof being set lower than the first and second front end portions of the first and second thrust pin groups and thrust up the semiconductor chip by use of the third front end portions thereof with the adhesive sheet disposed therebetween; a pin holder on which base portions of the first to third groups of thrust pins are mounted; a backup holder in which the pin holder having the first to third thrust pin groups mounted thereon is received and which is arranged on a second surface of the adhesive sheet opposite to the first surface; a moving mechanism which is constructed to relatively move the position of each semiconductor chip on the fixing table and the position of the backup holder; and a suction device which is constructed to fix the adhesive sheet to which the semiconductor chip to be picked up is affixed by drawing a vacuum on the inside of the backup holder; wherein the respective corner portions of the semiconductor chip are separated by use of the first thrust pin group while the nearby portion of the central portion of the semiconductor chip is kept in position by use of the second thrust pin group, then the respective sides of the semiconductor chip are separated by use of the third thrust pin group and the nearby portion of the central portion of the semiconductor chip is separated by use of the second thrust pin group.

According to another aspect of the present invention, there is provided a semiconductor chip pickup device which individually separates a plurality of semiconductor chips formed by discretely dividing a semiconductor wafer and removably affixed to a first surface of an adhesive sheet from the adhesive sheet comprising a fixing table on which the plurality of semiconductor chips are fixedly set with the semiconductor chips affixed to the adhesive sheet; a first group of thrust pins which are arranged in positions corresponding to corner portions of one of the semiconductor chips and thrust up the semiconductor chip by use of first front end portions thereof with the adhesive sheet disposed therebetween; a second group of thrust pins which are arranged in positions corresponding to a nearby portion of a central portion of the semiconductor chip and thrust up the semiconductor chip by use of second front end portions thereof with the adhesive sheet disposed therebetween; a pin holder on which base portions of the first and second thrust pin groups are mounted; a backup holder in which the pin holder having the first and second thrust pin groups mounted thereon is received and which is arranged on a second surface of the adhesive sheet opposite to the first surface; a moving mechanism which is constructed to relatively move the position of each semiconductor chip on the fixing table and the position of the backup holder; a suction device which is constructed to fix the adhesive sheet to which the semiconductor chip to be picked up is affixed by drawing a vacuum on the inside of the backup holder; and a pin position controller which controls the second front end portions of the second thrust pin group to be set lower than the first front end portions of the first thrust pin group at the time of separation of the semiconductor chip; wherein the respective corner portions of the semiconductor chip are separated by use of the first thrust pin group and then the nearby portion of the central portion of the semiconductor chip is separated by use of the second thrust pin group.

According to another aspect of the present invention, there is provided a semiconductor device manufacturing apparatus comprising a semiconductor chip pickup device which individually separates a plurality of semiconductor chips formed by discretely dividing a semiconductor wafer and removably affixed to a first surface of an adhesive sheet from the adhesive sheet; the pickup device including a fixing table on which the plurality of semiconductor chips are fixedly set with the semiconductor chips affixed to the adhesive sheet; a first group of thrust pins which are arranged in positions corresponding to corner portions of one of the semiconductor chips and thrust up the semiconductor chip by use of first front end portions thereof with the adhesive sheet disposed therebetween; a second group of thrust pins which are arranged in positions corresponding to a nearby portion of a central portion of the semiconductor chip with second front end portions thereof being set lower than the first front end portions of the first thrust pin group and thrust up the semiconductor chip by use of the second front end portions thereof with the adhesive sheet disposed therebetween; a pin holder on which base portions of the first and second groups of thrust pins are mounted; a backup holder in which the pin holder having the first and second thrust pin groups mounted thereon is received and which is arranged on a second surface of the adhesive sheet opposite to the first surface; a moving mechanism which is constructed to relatively move the position of each semiconductor chip on the fixing table and the position of the backup holder; and a suction device which is constructed to fix the adhesive sheet to which the semiconductor chip to be picked up is affixed by drawing a vacuum on the inside of the backup holder; wherein the respective corner portions of the semiconductor chip are separated by use of the first thrust pin group and then the nearby portion of the central portion of the semiconductor chip is separated by use of the second thrust pin group.

According to another aspect of the present invention, there is provided a semiconductor device manufacturing apparatus comprising a semiconductor chip pickup device which individually separates a plurality of semiconductor chips formed by discretely dividing a semiconductor wafer and removably affixed to a first surface of an adhesive sheet from the adhesive sheet; the pickup device including a fixing table on which the plurality of semiconductor chips are fixedly set with the semiconductor chips affixed to the adhesive sheet; a first group of thrust pins which are arranged in positions corresponding to corner portions of one of the semiconductor chips and thrust up the semiconductor chip by use of first front end portions thereof with the adhesive sheet disposed therebetween; a second group of thrust pins which are arranged in positions corresponding to a nearby portion of a central portion of the semiconductor chip with second front end portions thereof being set at substantially the same height as the first front end portions of the first thrust pin group and thrust up the semiconductor chip by use of the second front end portions thereof with the adhesive sheet disposed therebetween; a third group of thrust pins which are arranged in positions corresponding to respective sides of the semiconductor chip and lying between the thrust pins of the first thrust pin group with third front end portions thereof being set lower than the first and second front end portions of the first and second thrust pin groups and thrust up the semiconductor chip by use of the third front end portions thereof with the adhesive sheet disposed therebetween; a pin holder on which base portions of the first to third groups of thrust pins are mounted; a backup holder in which the pin holder having the first to third thrust pin groups mounted thereon is received and which is arranged on a second surface of the adhesive sheet opposite to the second surface; a moving mechanism which is constructed to relatively move the position of each semiconductor chip on the fixing table and the position of the backup holder; and a suction device which is constructed to fix the adhesive sheet to which the semiconductor chip to be picked up is affixed by drawing a vacuum on the inside of the backup holder; wherein the respective corner portions of the semiconductor chip are separated by use of the first thrust pin group while the nearby portion of the central portion of the semiconductor chip is kept in position by use of the second thrust pin group, then the respective sides of the semiconductor chip are separated by use of the third thrust pin group and the nearby portion of the central portion of the semiconductor chip is separated by use of the second thrust pin group.

According to another aspect of the present invention, there is provided a semiconductor device manufacturing apparatus comprising a semiconductor chip pickup device which individually separates a plurality of semiconductor chips formed by discretely dividing a semiconductor wafer and removably affixed to a first surface of an adhesive sheet from the adhesive sheet; the pickup device including a fixing table on which the plurality of semiconductor chips are fixedly set with the semiconductor chips affixed to the adhesive sheet; a first group of thrust pins which are arranged in positions corresponding to corner portions of one of the semiconductor chips and thrust up the semiconductor chip by use of first front end portions thereof with the adhesive sheet disposed therebetween; a second group of thrust pins which are arranged in positions corresponding to a nearby portion of a central portion of the semiconductor chip and thrust up the semiconductor chip by use of second front end portions thereof with the adhesive sheet disposed therebetween; a pin holder on which base portions of the first and second groups of thrust pins are mounted; a backup holder in which the pin holder having the first and second thrust pin groups mounted thereon is received and which is arranged on a second surface of the adhesive sheet opposite to the first surface; a moving mechanism which is constructed to relatively move the position of each semiconductor chip on the fixing table and the position of the backup holder; a suction device which is constructed to fix the adhesive sheet to which the semiconductor chip to be picked up is affixed by drawing a vacuum on the inside of the backup holder; and a pin position controller which controls the second front end portions of the second thrust pin group to be set lower than the first front end portions of the first thrust pin group at the time of separation of the semiconductor chip; wherein the respective corner portions of the semiconductor chip are separated by use of the first thrust pin group and then the nearby portion of the central portion of the semiconductor chip is separated by use of the second thrust pin group.

According to another aspect of the invention, there is provided a semiconductor chip pickup method which individually separates a plurality of semiconductor chips formed by discretely dividing a semiconductor wafer and affixed to an adhesive sheet from the adhesive sheet comprising relatively moving the position of a fixing table and the position of a backup holder to set first and second thrust pin groups to a position corresponding to one of the semiconductor chips which is to be picked up; separating the corner portions of the semiconductor chip from the adhesive sheet by projecting the first thrust pin group from the backup holder to thrust up the semiconductor chip with the adhesive sheet disposed therebetween and thereby bend the semiconductor chip into a concave shape while drawing a vacuum on the inside of the backup holder to hold the adhesive sheet by suction; and separating a nearby portion of a central portion of the semiconductor chip bent into a concave shape from the adhesive sheet, while holding the nearby portion of the central portion of the semiconductor chip by the second thrust pin group, by projecting the second thrust pin group from the backup holder to a position which is lower than that of the first thrust pin group to thrust up the semiconductor chip with the adhesive sheet disposed therebetween while drawing a vacuum on the inside of the backup holder to hold the adhesive sheet by suction.

According to another aspect of the invention, there is provided a semiconductor chip pickup method which individually separates a plurality of semiconductor chips formed by discretely dividing a semiconductor wafer and affixed to an adhesive sheet from the adhesive sheet comprising relatively moving the position of a fixing table and the position of a backup holder to set first to third thrust pin groups to a position corresponding to one of the semiconductor chips which is to be picked up; separating the corner portions of the semiconductor chip from the adhesive sheet by projecting the first thrust pin group from the backup holder to thrust up the semiconductor chip with the adhesive sheet disposed therebetween and thereby bend the semiconductor chip into a concave shape while drawing a vacuum on the inside of the backup holder to hold the adhesive sheet by suction; keeping a nearby portion of a central portion of the semiconductor chip bent into a concave shape in position by projecting the second thrust pin group from the backup holder to a position which is lower than that of the first thrust pin group to thrust up the semiconductor chip with the adhesive sheet disposed therebetween while drawing a vacuum on the inside of the backup holder to hold the adhesive sheet by suction; separating respective sides of the semiconductor chip by projecting the third thrust pin group from the backup holder to a position which is lower than that of the second thrust pin group to thrust up the semiconductor chip with the adhesive sheet disposed therebetween while drawing a vacuum on the inside of the backup holder to hold the adhesive sheet by suction; and separating the nearby portion of the central portion of the semiconductor chip by use of the second thrust pin group.

According to another aspect of the invention, there is provided a semiconductor chip pickup method which individually separates a plurality of semiconductor chips formed by discretely dividing a semiconductor wafer and affixed to an adhesive sheet from the adhesive sheet comprising relatively moving the position of a fixing table and the position of a backup holder to set first to third thrust pin groups to a position corresponding to one of the semiconductor chips which is to be picked up; separating corner portions of the semiconductor chip from the adhesive sheet by bending the semiconductor chip into a concave shape by use of the first thrust pin group, while keeping a nearby portion of a central portion of the semiconductor chip in position by use of the second thrust pin group by projecting the first and second thrust pin groups from the backup holder to thrust up the semiconductor chip with the adhesive sheet disposed therebetween while drawing a vacuum on the inside of the backup holder to hold the adhesive sheet by suction; separating respective sides of the semiconductor chip by projecting the third thrust pin group from the backup holder to a position which is lower than that of the first and second thrust pin groups to thrust up the semiconductor chip with the adhesive sheet disposed therebetween while drawing a vacuum on the inside of the backup holder to hold the adhesive sheet by suction; and separating the nearby portion of the central portion of the semiconductor chip by use of the second thrust pin group.

According to another aspect of the invention, there is provided a semiconductor device manufacturing method comprising forming elements on a main surface of a semiconductor wafer; forming a plurality of semiconductor chips by discretely dividing the semiconductor wafer on which the elements have been formed along one of dicing lines and chip dividing lines; affixing the plurality of discretely divided semiconductor chips to an adhesive sheet and fixedly setting the plurality of semiconductor chips on a fixing table; moving the fixing table to set first and second thrust pin groups to a position corresponding to one of the semiconductor chips which is to be picked up; separating corner portions of the semiconductor chip from the adhesive sheet by projecting the first thrust pin group from the backup holder to thrust up the semiconductor chip with the adhesive sheet disposed therebetween and thereby bend the semiconductor chip into a concave shape while drawing a vacuum on the inside of the backup holder to hold the adhesive sheet by suction; separating a nearby portion of a central portion of the semiconductor chip from the adhesive sheet, while holding the nearby portion of the central portion of the semiconductor chip by the second thrust pin group, by projecting the second thrust pin group from the backup holder to a position which is lower than that of the first thrust pin group to thrust up the semiconductor chip with the adhesive sheet disposed therebetween while drawing a vacuum on the inside of the backup holder to hold the adhesive sheet by suction; and setting the pressure in the internal portion of the backup holder back to atmospheric pressure and holding and picking up the semiconductor chip by suction by use of a collet.

According to another aspect of the invention, there is provided a semiconductor device manufacturing method comprising: forming elements on a main surface of a semiconductor wafer; forming a plurality of semiconductor chips by discretely dividing the semiconductor wafer on which the elements have been formed along one of dicing lines and chip dividing lines; affixing the plurality of discretely divided semiconductor chips to an adhesive sheet and fixedly setting the plurality of semiconductor chips on a fixing table; moving the fixing table to set first and third thrust pin groups to a position corresponding to the semiconductor chip to be picked up; separating corner portions of the semiconductor chip from the adhesive sheet by projecting the first thrust pin group from the backup holder to thrust up the semiconductor chip with the adhesive sheet disposed therebetween and thereby bend the semiconductor chip into a concave shape while drawing a vacuum on the inside of the backup holder to hold the adhesive sheet by suction; keeping a nearby portion of a central portion of the semiconductor chip in position by projecting the second thrust pin group from the backup holder to a position which is lower than that of the first thrust pin group to thrust up the semiconductor chip with the adhesive sheet disposed therebetween while drawing a vacuum on the inside of the backup holder to hold the adhesive sheet by suction; separating respective sides of the semiconductor chip by projecting the third thrust pin group from the backup holder to a position which is lower than that of the second thrust pin group to thrust up the semiconductor chip with the adhesive sheet disposed therebetween while drawing a vacuum on the inside of the backup holder to hold the adhesive sheet by suction; separating the nearby portion of the central portion of the semiconductor chip by use of the second thrust pin group; and setting the pressure in the internal portion of the backup holder back to atmospheric pressure and holding and picking up the thus separated semiconductor chip by suction by use of a collet.

According to another aspect of the invention, there is provided a semiconductor device manufacturing method comprising forming elements on a main surface of a semiconductor wafer; forming a plurality of semiconductor chips by discretely dividing the semiconductor wafer on which the elements have been formed along one of dicing lines and chip dividing lines; affixing the plurality of discretely divided semiconductor chips to an adhesive sheet and fixedly setting the plurality of semiconductor chips on a fixing table; moving the fixing table to set first and third thrust pin groups to a position corresponding to one of the semiconductor chips which is to be picked up; separating corner portions of the semiconductor chip from the adhesive sheet by bending the semiconductor chip into a concave shape by use of the first thrust pin group, while keeping a nearby portion of a central portion of the semiconductor chip in position by use of the second thrust pin group by projecting the first and second thrust pin groups from the backup holder to thrust up the semiconductor chip with the adhesive sheet disposed therebetween while drawing a vacuum on the inside of the backup holder to hold the adhesive sheet by suction; separating respective sides of the semiconductor chip by projecting the third thrust pin group from the backup holder to a position which is lower than that of the first and second thrust pin groups to thrust up the semiconductor chip with the adhesive sheet disposed therebetween while drawing a vacuum on the inside of the backup holder to hold the adhesive sheet by suction; separating the nearby portion of the central portion of the semiconductor chip by use of the second thrust pin group; and setting the pressure in the internal portion of the backup holder back to atmospheric pressure and holding and picking up the semiconductor chip by suction by use of a collet.

BRIEF DESCRIPTION OF THE SEVERAL VIEWS OF THE DRAWING

FIG. 6A is a cross sectional view showing a fourth step, for illustrating a problem occurring in the conventional pickup method;

FIG. 6B is a perspective view showing the semiconductor chip in the fourth step as viewed from above, for illustrating a problem occurring in the conventional pickup method;

FIG. 7A is a cross sectional view showing a first step, for illustrating another problem occurring in the conventional pickup method;

FIG. 7B is a perspective view showing the semiconductor chip in the first step as viewed from above, for illustrating another problem occurring in the conventional pickup method;

FIG. 8A is a cross sectional view showing a second step, for illustrating another problem occurring in the conventional pickup method;

FIG. 8B is a perspective view showing the semiconductor chip in the first step as viewed from above, for illustrating another problem occurring in the conventional pickup method;

FIG. 9A is a cross sectional view showing a third step, for illustrating another problem occurring in the conventional pickup method;

FIG. 9B is a perspective view showing the semiconductor chip in the third step as viewed from above, for illustrating another problem occurring in the conventional pickup method;

FIG. 10A is a cross sectional view showing a fourth step, for illustrating another problem occurring in the conventional pickup method;

FIG. 10B is a perspective view showing the semiconductor chip in the fourth step as viewed from above, for illustrating another problem occurring in the conventional pickup method;

FIG. 12 is a cross sectional view showing an example of the construction of the main portion of the pickup device in the die bonder shown in FIG. 11;

FIG. 13A is a side view showing a semiconductor chip pickup jig shown in FIG. 12;

FIG. 13B is a top view showing the semiconductor chip pickup jig shown in FIG. 12;

FIG. 18A is a cross sectional view showing a first step, for illustrating a semiconductor chip pickup method according to the third embodiment of this invention;

FIG. 18B is a perspective view showing the semiconductor chip in the first step as viewed from above, for illustrating the semiconductor chip pickup method according to the third embodiment of this invention;

FIG. 19A is a cross sectional view showing a second step, for illustrating the semiconductor chip pickup method according to the third embodiment of this invention;

FIG. 19B is a perspective view showing the semiconductor chip in the second step as viewed from above, for illustrating the semiconductor chip pickup method according to the third embodiment of this invention;

FIG. 20A is a cross sectional view showing a third step, for illustrating the semiconductor chip pickup method according to the third embodiment of this invention;

FIG. 20B is a perspective view showing the semiconductor chip in the third step as viewed from above, for illustrating the semiconductor chip pickup method according to the third embodiment of this invention;

FIG. 29A is a cross sectional view showing a fourth step, for illustrating the semiconductor chip pickup method according to the fifth embodiment of this invention;

FIG. 29B is a perspective view showing the semiconductor chip in the fourth step as viewed from above, for illustrating the semiconductor chip pickup method according to the fifth embodiment of this invention;

FIG. 30 is a cross sectional view showing a semiconductor chip pickup jig, for illustrating a semiconductor device manufacturing apparatus, semiconductor chip pickup device and semiconductor chip pickup jig according to a sixth embodiment of this invention;

FIG. 31 is a cross sectional view showing a semiconductor chip pickup jig, for illustrating a semiconductor device manufacturing apparatus, semiconductor chip pickup device and semiconductor chip pickup jig according to a seventh embodiment of this invention;

FIG. 32 is a cross sectional view showing a semiconductor chip pickup jig, for illustrating a semiconductor device manufacturing apparatus, semiconductor chip pickup device and semiconductor chip pickup jig according to an eighth embodiment of this invention;

DETAILED DESCRIPTION OF THE INVENTION

[First Embodiment]

Figure 1:
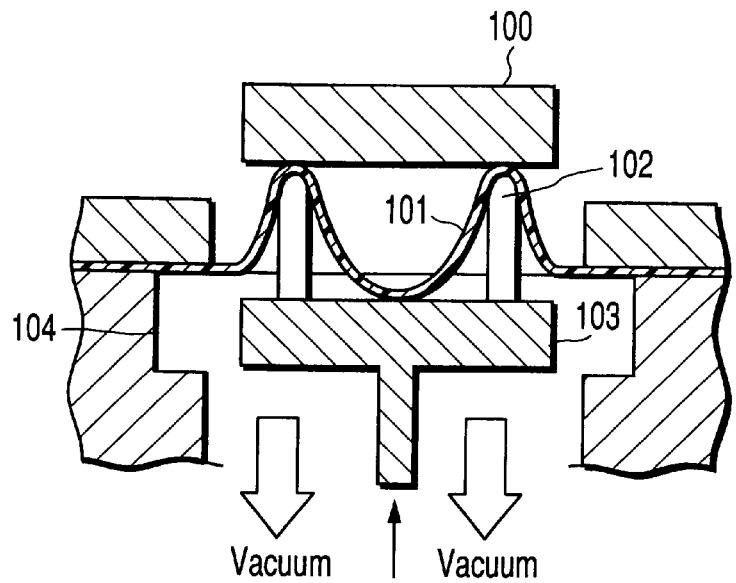
FIG. 1 is a cross sectional view of an enlarged main constituting portion of the conventional pickup device which picks up semiconductor chips from a adhesive sheet.
Figure 2A:
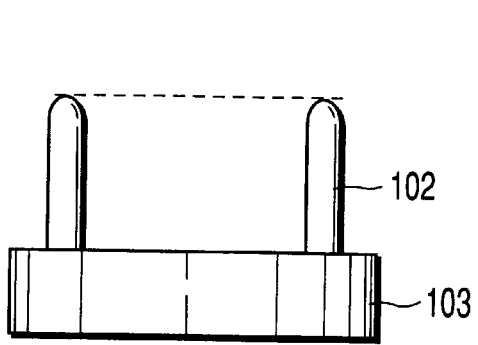
FIG. 2A is a side view showing a pin holder, for illustrating a semiconductor chip pickup jig used in the pickup device shown in FIG. 1.
Figure 2B:
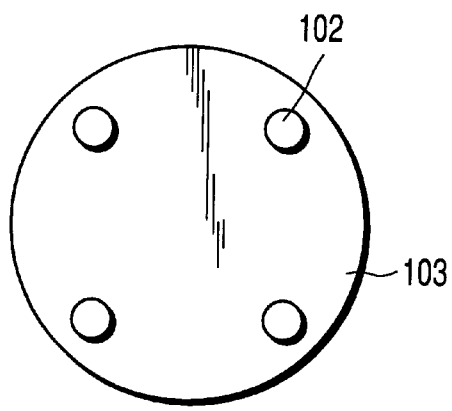
FIG. 2B is a top view showing the pin holder, for illustrating the semiconductor chip pickup jig used in the pickup device shown in FIG. 1.
Figure 3A:
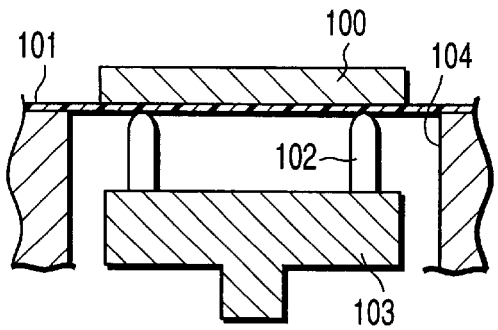
FIG. 3A is a cross sectional view showing a first step, for illustrating a problem occurring in the conventional pickup method.
Figure 3B:
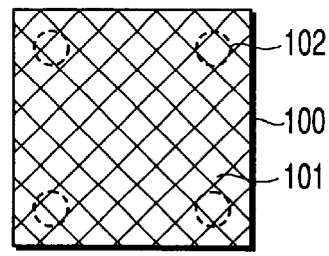
FIG. 3B is a perspective view showing the semiconductor chip in the first step as viewed from above, for illustrating a problem occurring in the conventional pickup method.
Figure 4A:
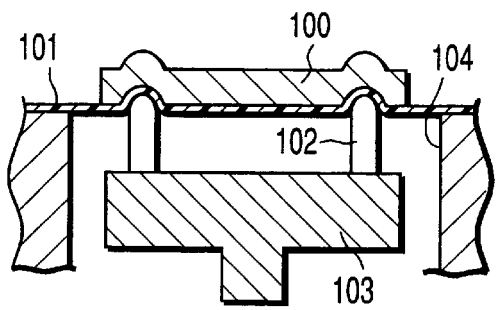
FIG. 4A is a cross sectional view showing a second step, for illustrating a problem occurring in the conventional pickup method.
Figure 4B:
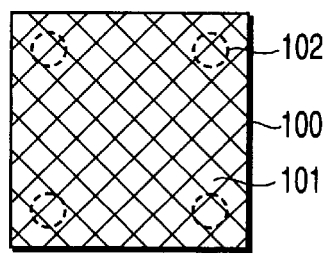
FIG. 4B is a perspective view showing the semiconductor chip in the second step as viewed from above, for illustrating a problem occurring in the conventional pickup method.
Figure 5A:
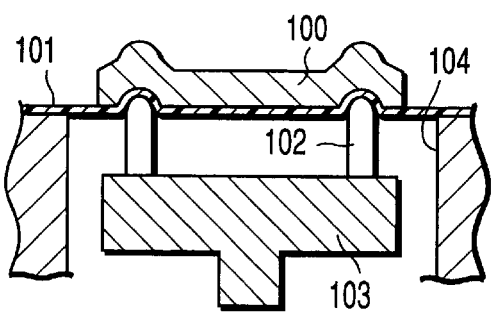
FIG. 5A is a cross sectional view showing a third step, for illustrating a problem occurring in the conventional pickup method.
Figure 5B:
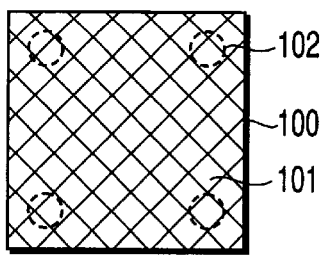
FIG. 5B is a perspective view showing the semiconductor chip in the third step as viewed from above, for illustrating a problem occurring in the conventional pickup method.
Figure 11:
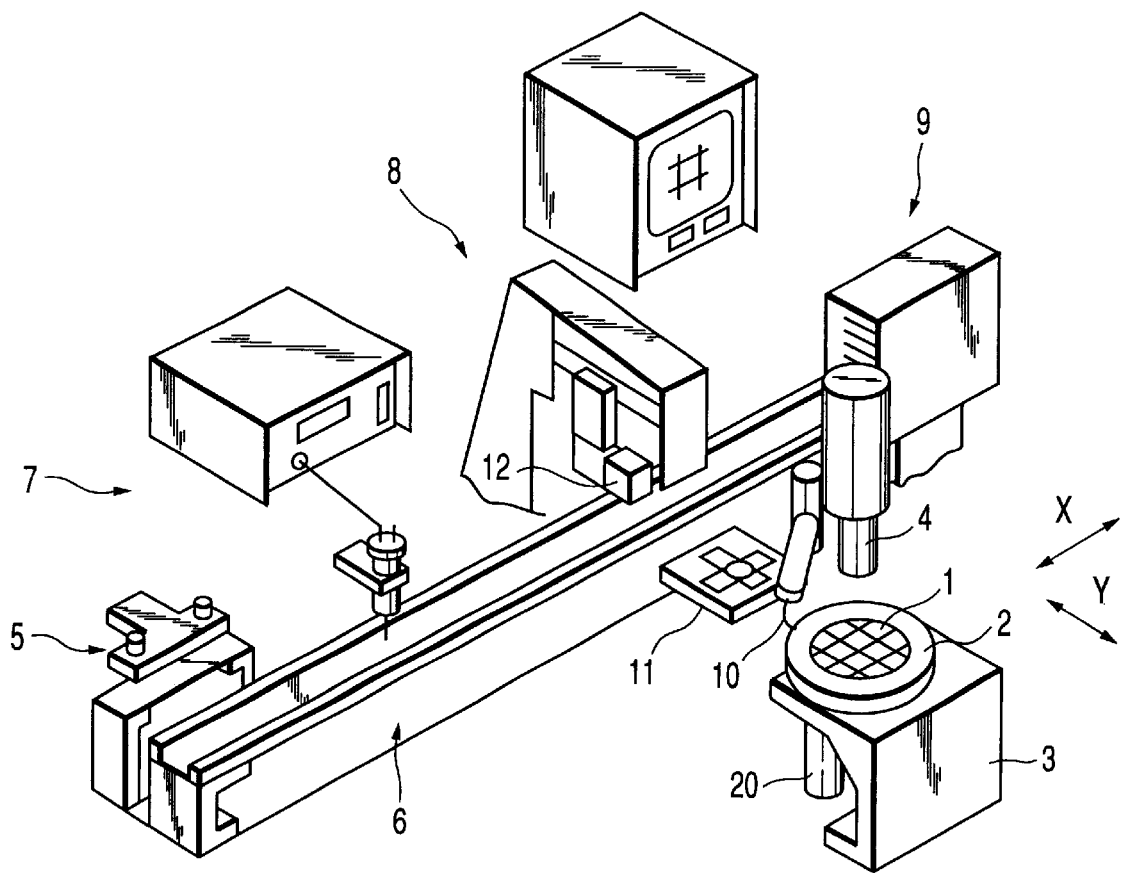
FIG. 11 is a perspective view showing the schematic construction of a die bonder, for illustrating a semiconductor device manufacturing apparatus, semiconductor chip pickup device and semiconductor chip pickup jig according to a first embodiment of this invention.

FIGS. 11, 12, 13A and 13B illustrate a semiconductor device manufacturing apparatus, semiconductor chip pickup device and semiconductor chip pickup jig according to a first embodiment of this invention. FIG. 11 is a perspective view showing the schematic construction of a die bonder, FIG. 12 is a cross sectional view showing an example of the construction of the main portion of the pickup device in the die bonder, FIG. 13A is a side view showing the semiconductor chip pickup jig, and FIG. 13B is a top view showing the semiconductor chip pickup jig.

The die bonder shown in FIG. 11 includes a pickup mechanism which picks up a semiconductor chip, a transfer mechanism which transfers the picked-up semiconductor chip onto a lead frame, and a feed mechanism which feeds the lead frame. The pickup mechanism includes a fixing table 3, TV camera 4, pickup device 20 and the like. A wafer ring 2 having an adhesive sheet attached thereto to which discretely divided semiconductor chips 1 having elements formed thereon are removably affixed is mounted on the fixing table 3. The fixing table 3 individually moves the semiconductor chip 1 onto the pickup device 20 by moving the wafer ring 2 in XY directions. The TV camera 4 is used to monitor the surface of the semiconductor chip 1. The pickup device 20 is placed under the fixing table 3 and used to separate the semiconductor chip 1 by thrusting the semiconductor chip from the rear surface side of the adhesive sheet by use of thrust pins.

The transfer mechanism which transfers the semiconductor chip 1 onto the lead frame includes a bonding tool 8, suction head 10, position correction stage 11, bonding head 12 and the like. The suction head 10 holds the semiconductor chip 1 which has been separated from the adhesive sheet by suction and transfers the same onto the position correction stage 11. On the position correction stage 11, the position of the semiconductor chip 1 is corrected. The semiconductor chip 1 whose position is corrected is transferred onto the lead frame by the bonding head 8.

Further, the feed mechanism which feeds the lead frame includes a lead frame supply section 5, lead frame feeding device 6, paste supply device 7, lead frame receiving section 9 and the like. In the lead frame supply section 5, lead frames which are not yet subjected to the die bonding process are received and it sequentially feeds the lead frames to the lead frame feeding device 6. The paste supply device 7 coats conductive paste on the bed portion of the lead frame fed along the lead frame feeding device 6. Further, the lead frame receiving section 9 receives the lead frames which have been subjected to the die bonding process.

With the above construction, first, the wafer ring 2 having an adhesive sheet attached thereto to which a plurality of semiconductor chips 1 are affixed is mounted on the fixing table 3. At this time, a plurality of semiconductor chips 1 are formed by discretely dividing a wafer on which elements have been formed, the semiconductor chips 1 are affixed (transferred) to the adhesive sheet attached to the wafer ring 2, and then the wafer ring 2 is mounted on the fixing table 3. Alternatively, kerfs (grooves) are formed along dicing lines (chip dividing lines) in the element forming surface of the wafer on which elements have been formed, an adhesive sheet is affixed to the element forming surface, the wafer is discretely divided by grinding the rear surface of the wafer at least to reach the kerfs (dicing before grinding method), and something on which a plurality of semiconductor chips 1 are formed is fixed on the holding table 3. In either case of the above methods, formation of elements on the main surface of the semiconductor wafer is performed by a known manufacturing process.

Next, the fixing table 3 is moved in the XY directions so as to set the pickup device 20 to a position corresponding to one of the semiconductor chips 1 which is to be picked up (separated). After this, the surface of the semiconductor chip 1 is monitored by use of the TV camera 4, image data obtained by monitoring is converted into binary data or multivalue data and a process to detect the position of the semiconductor chip, a mark detection process to determine a good product or defective product and the like are performed. Then, the semiconductor chip is separated by projecting (raising) the thrust pins from the upper surface of the backup holder to thrust up the semiconductor chip 1 with the adhesive sheet disposed therebetween while drawing a vacuum on the inside portion of the backup holder of the pickup device 20. The separated semiconductor chip 1 is held by suction by the suction head 10 and transferred to the position correction stage 11, and after the position of the semiconductor chip 1 is corrected, it is transferred onto the lead frame by the bonding head 8.

After termination of the pickup process, the operation to draw a vacuum on the inside portion of the backup holder is terminated to set the pressure in the internal portion of the backup holder back to an atmospheric pressure, the fixing table 3 is moved to a position of one of the semiconductor chips 1 which is next picked up and the above operation is repeatedly effected.

The lead frame supply section 5 sequentially feeds lead frames to the lead frame feeding device 6 and conductive paste is dropped from the paste supply device 7 onto the bed portion of each lead frame fed by the lead frame feeding device 6. After this, the semiconductor chip 1 transferred by the bonding head 8 is mounted (die bonded) on the bed portion of the lead frame. The lead frame which has been subjected to the die bonding process is received into the lead frame receiving section 9 and the same operation is repeatedly effected.

FIG. 12 is a cross sectional view showing the main portion of the pickup device 20 used in the die bonder shown in FIG. 11. The semiconductor chips 1 removably affixed to the adhesive sheet 22 are arranged on the upper surface of the backup holder 21 and a vacuum is drawn on the inside of the backup holder 21 to hold the adhesive sheet 21 by suction and fix the semiconductor chips 1. Inside the backup holder 21, a pin holder 23 is received and vertically moved in the backup holder 21. First and second thrust pin groups 24a, 24b are mounted on the pin holder 23. By the vertical movement of the pin holder 23, the thrust pins of the groups 24a, 24b project from the upper surface of the backup holder 21 to separate the semiconductor chip 1 from the adhesive sheet 22.

FIGS. 13A and 13B illustrate a semiconductor chip pickup jig in the pickup device shown in FIG. 12, and FIG. 13A is a side view showing the pin holder 23 and thrust pin groups 24a, 24b shown in FIG. 12 and FIG. 13B is a top view showing the pin holder 23 and thrust pin groups 24a, 24b shown in FIG. 12. Base portions of the two types of thrust pin groups 24a, 24b having different lengths are mounted on the pin holder 23. The thrust pins of the first group 24a are arranged in positions corresponding to the corner portions of the semiconductor chip 1. Further, the thrust pins of the second group 24b are arranged in positions corresponding to the nearby portion of the central portion of the semiconductor chip 1 and the front end portion thereof is set lower than the front end portion of the first thrust pin group 23a by zz1 ($\geq 0.4$ mm).

With the above structure, at the time of separation of the semiconductor chip 1 from the adhesive sheet 22, the corner portions are first separated by the first thrust pin group 24a and then the nearby portion of the central portion is separated by the second thrust pin group 24b. Thus, the semiconductor chip 1 can be suppressed from being bent by the second thrust pin group 24b when the semiconductor chip 1 whose thickness is reduced is separated and occurrence of cracks can be prevented since the semiconductor chip 1 is gradually separated. Further, the semiconductor chip 1 is separated by use of a large number of thrust pins of the groups 24a, 24b unlike the conventional case in which only the corner portions of the semiconductor chip are thrust and separated. Therefore, it is possible to suppress stress from being concentrated on the front end portions of the thrust pins and prevent the thrust pins from penetrating through the semiconductor chip 1.

Thus, it is possible to attain a semiconductor chip pickup jig, semiconductor chip pickup device and semiconductor chip pickup method which can suppress occurrence of cracks when the semiconductor chip 1 whose thickness is reduced is separated from the adhesive sheet.

Further, it is possible to attain a semiconductor device manufacturing apparatus and semiconductor device manufacturing method which can enhance the manufacturing yield and suppress occurrence of cracks when the semiconductor chip 1 which is made thin is separated from the adhesive sheet.

In the first embodiment, a case wherein the number of thrust pins 24b is four is explained as an example, but it is of course possible to increase or decrease the number of thrust pins according to the size and thickness of the semiconductor chip 1 to be separated. For example, when the semiconductor chip 1 is large or thin, the number of thrust pins 24b may be increased and when the semiconductor chip 1 is small or relatively thick, the number of thrust pins 24b may be decreased. However, it becomes difficult to separate the semiconductor chip if the number of thrust pins 24b is excessively large, and therefore, it is preferable to set the number of thrust pins to approx. 24 at maximum.

[Second Embodiment]

Figure 14:
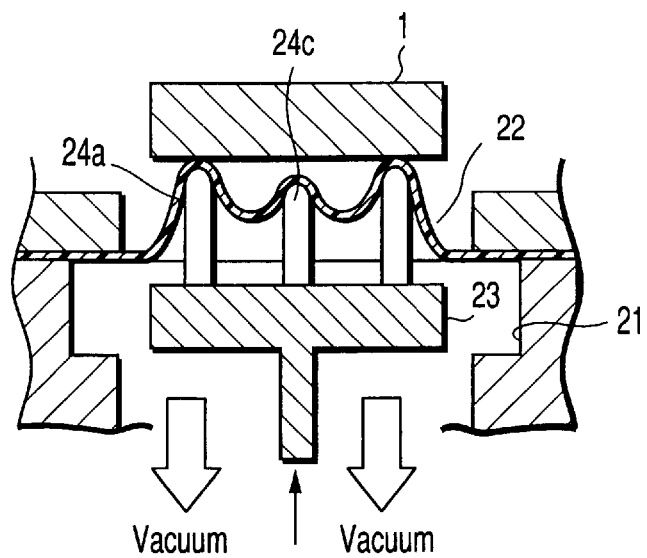
FIG. 14 is a cross sectional view showing another example of the construction of the main portion of the pickup device in the die bonder shown in FIG. 11, for illustrating a semiconductor device manufacturing apparatus, semiconductor chip pickup device and semiconductor chip pickup jig according to a second embodiment of this invention.
Figure 15A:
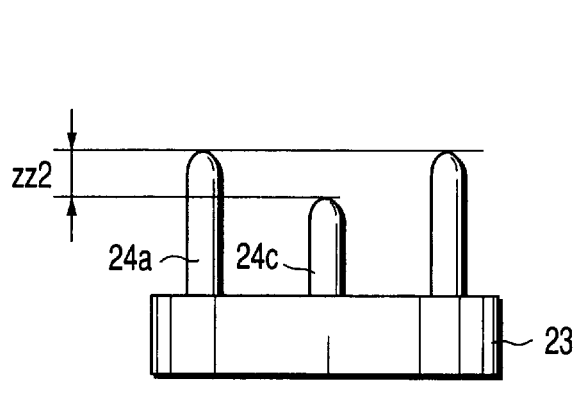
FIG. 15A is a side view showing the semiconductor chip pickup jig shown in FIG. 14.
Figure 15B:
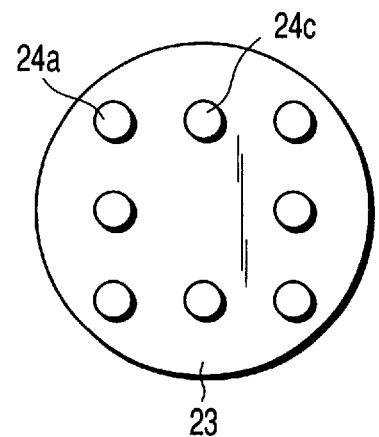
FIG. 15B is a top view showing the semiconductor chip pickup jig shown in FIG. 14.

FIGS. 14, 15A and FIG. 15B respectively illustrate a semiconductor device manufacturing apparatus, semiconductor chip pickup device and semiconductor chip pickup jig according to a second embodiment of this invention. FIG. 14 is a cross sectional view showing another example of the construction of the main portion of the pickup device in the die bonder shown in FIG. 11, FIG. 15A is a side view showing the semiconductor chip pickup jig and FIG. 15B is a top view showing the semiconductor chip pickup jig.

As shown in FIGS. 14, 15A and 15B, the present embodiment is different from the first embodiment in the arrangement of the thrust pins. That is, in the present embodiment, thrust pins of a first group 24a are arranged in positions corresponding to the corner portions of the semiconductor chip 1 and thrust pins of a second group 24b are arranged in positions set between the thrust pins of the first group 24a and corresponding to the respective sides of the semiconductor chip 1. The front end portion of the second thrust pin group 24c is set lower than the front end portion of the first thrust pin group 23a by zz2 (0.05 to 0.6 mm).

With the above structure, at the time of separation of the semiconductor chip 1 from the adhesive sheet 22, the corner portions are first separated by the first thrust pin group 24a and then the respective sides of the semiconductor chip 1 are separated by the second thrust pin group 24c. Thus, the semiconductor chip 1 can be suppressed from being bent when the semiconductor chip 1 whose thickness is reduced is separated and occurrence of cracks can be prevented since the semiconductor chip 1 is gradually separated. Further, the semiconductor chip 1 is separated by use of a large number of thrust pins of the groups 24a, 24c unlike the conventional case in which only the corner portions of the semiconductor chip are thrust and separated. Therefore, it is possible to suppress stress from being concentrated on the front end portions of the thrust pins and prevent the thrust pins from penetrating through the semiconductor chip.

Thus, it is possible to attain a semiconductor chip pickup jig, semiconductor chip pickup device and semiconductor chip pickup method which can suppress occurrence of cracks when the semiconductor chip which is made thin is separated from the adhesive sheet.

Further, it is possible to attain a semiconductor device manufacturing apparatus and semiconductor device manufacturing method which can enhance the manufacturing yield and suppress occurrence of cracks when the semiconductor chip 1 which is made thin is separated from the adhesive sheet.

In the second embodiment, a case wherein the number of thrust pins 24c is four is explained as an example, but like the first embodiment, it is of course possible to increase or decrease the number of thrust pins according to the size and thickness of the semiconductor chip 1 to be separated. At this time, it becomes difficult to separate the semiconductor chip if the number of thrust pins 24c is excessively large, and therefore, it is preferable to set the number of thrust pins to approx. 24 at maximum.

[Third Embodiment]

Figure 16:
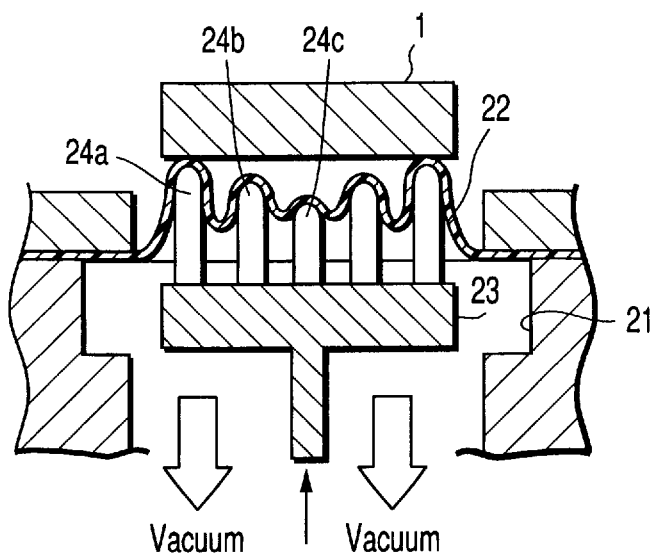
FIG. 16 is a cross sectional view showing still another example of the construction of the main portion of the pickup device in the die bonder shown in FIG. 11, for illustrating a semiconductor device manufacturing apparatus, semiconductor chip pickup device and semiconductor chip pickup jig according to a third embodiment of this invention.
Figure 17A:
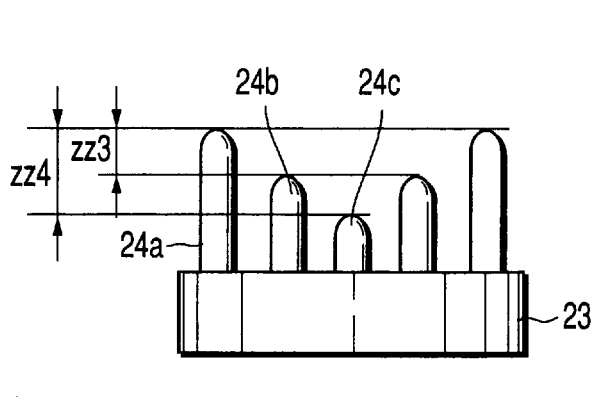
FIG. 17A is a side view showing the semiconductor chip pickup jig shown in FIG. 16.
Figure 17B:
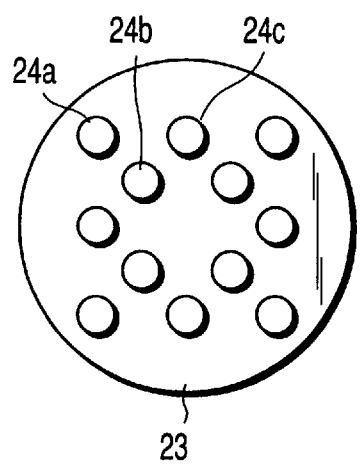
FIG. 17B is a top view showing the semiconductor chip pickup jig shown in FIG. 16.

FIGS. 16, 17A and 17B illustrate a semiconductor device manufacturing apparatus, semiconductor chip pickup device and semiconductor chip pickup jig according to a third embodiment of this invention. FIG. 16 is a cross sectional view showing still another example of the construction of the main portion of the pickup device in the die bonder shown in FIG. 11, FIG. 17A is a side view showing the semiconductor chip pickup jig and FIG. 17B is a top view showing the semiconductor chip pickup jig.

As shown in FIGS. 16, 17A and 17B, the third embodiment is constructed by combining the arrangements of the thrust pins of the first and second embodiments. That is, the thrust pin groups of the third embodiment include a first group 24a of thrust pins arranged in positions corresponding to the corner portions of the semiconductor chip 1, a second group 24b of thrust pins arranged in positions corresponding to the nearby portion of the central portion of the semiconductor chip 1 and having front end portions set to be lower than the front end portions of the first thrust pin group 24a, and a third group 24c of thrust pins arranged in positions corresponding to the respective sides of the semiconductor chip 1 and lying between the thrust pins of the first group 24a and having front end portions set to be lower than the front end portions of the first and second thrust pin groups 24a, 24b. The front end portion of the second thrust pin group 24b is set lower than the front end portion of the first thrust pin group 23a by zz3 (0.05 to 0.4 mm), the front end portion of the third thrust pin group 24c is set lower than the front end portion of the first thrust pin group 23a by zz4 (0.1 to 1.0 mm) and zz4 is set to a larger value than zz3.

Figure 21A:
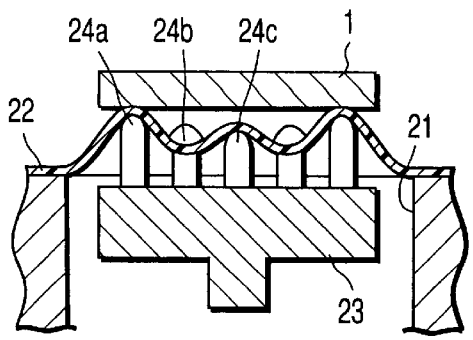
FIG. 21A is a cross sectional view showing a fourth step, for illustrating the semiconductor chip pickup method according to the third embodiment of this invention.
Figure 21B:
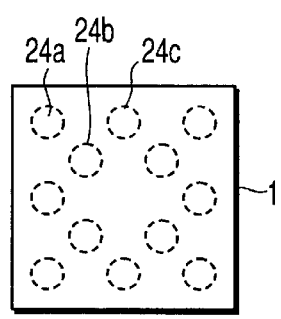
FIG. 21B is a perspective view showing the semiconductor chip in the fourth step as viewed from above, for illustrating the semiconductor chip pickup method according to the third embodiment of this invention.

With the above structure, at the time of separation of the semiconductor chip 1 from the adhesive sheet 22, the corner portions are first separated by the first thrust pin group 24a as shown in FIGS. 18A, 18B, 19A and 19B, then the nearby portion of the central portion of the semiconductor chip 1 is thrust and held in the thrust state by the second thrust pin group 24b as shown in FIGS. 20A and 20B, and the respective sides of the semiconductor chip 1 start to be separated while bending of the semiconductor chip 1 is kept suppressed. Then, after the respective sides of the semiconductor chip 1 are separated by the third thrust pin group 24c, the nearby portion of the central portion of the semiconductor chip 1 is separated by the second thrust pin group 24b and the semiconductor chip 1 is completely separated as shown in FIGS. 21A and 21B.

FIGS. 18B, 19B, 20B and 21B are perspective views of the semiconductor chip 1 as viewed from above and the contact surface between the semiconductor chip 1 and the adhesive sheet 22 is indicated by a mesh pattern so that the process of separation of the semiconductor chip 1 from the adhesive sheet 22 can be easily understood.

According to the above structure, the semiconductor chip 1 can be effectively suppressed from being bent when the semiconductor chip 1 which is made thin is separated and occurrence of cracks can be prevented by gradually enlarging the separated area of the semiconductor chip 1. Further, since the semiconductor chip 1 is separated by use of a large number of thrust pins of the groups 24a, 24b, 24c, stress can be more effectively suppressed from being concentrated on the front end portions of the thrust pins and the thrust pins can be prevented from penetrating through the semiconductor chip 1.

Thus, it is possible to attain a semiconductor chip pickup jig, semiconductor chip pickup device and semiconductor chip pickup method which can suppress occurrence of cracks when the semiconductor chip which is made thin is separated from the adhesive sheet.

Further, it is possible to attain a semiconductor device manufacturing apparatus and semiconductor device manufacturing method which can enhance the manufacturing yield and suppress occurrence of cracks when the semiconductor chip 1 which is made thin is separated from the adhesive sheet.

In the third embodiment, a case wherein the number of thrust pins in each of the groups 24b, 24c is four is explained as an example, but like the first and second embodiments, it is of course possible to increase or decrease the number of thrust pins according to the size and thickness of the semiconductor chip 1 to be separated. At this time, it becomes difficult to separate the semiconductor chip if the number of thrust pins 24b, 24c is excessively large, and therefore, it is preferable to set the number of thrust pins to approx. 24 at maximum.

[Fourth Embodiment]

Figure 22:
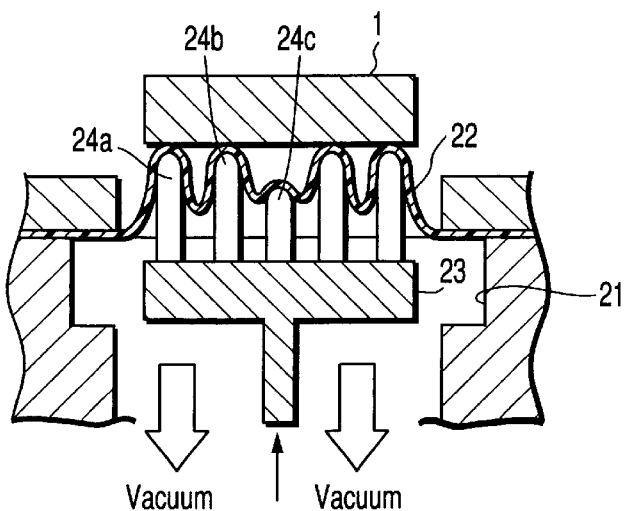
FIG. 22 is a cross sectional view showing still another example of the construction of the main portion of the pickup device in the die bonder shown in FIG. 11, for illustrating a semiconductor device manufacturing apparatus, semiconductor chip pickup device and semiconductor chip pickup jig according to a fourth embodiment of this invention.
Figure 23A:
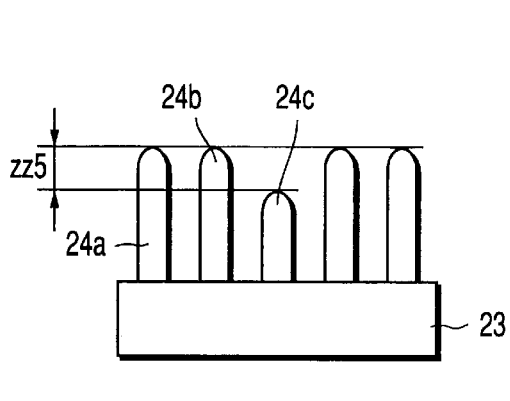
FIG. 23A is a side view showing the semiconductor chip pickup jig shown in FIG. 22.
Figure 23B:
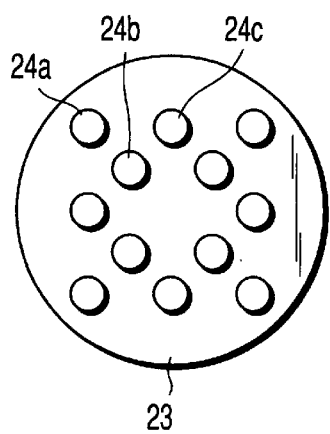
FIG. 23B is a top view showing the semiconductor chip pickup jig shown in FIG. 22.

FIGS. 22, 23A and 23B illustrate a semiconductor device manufacturing apparatus, semiconductor chip pickup device and semiconductor chip pickup jig according to a fourth embodiment of this invention. FIG. 22 is a cross sectional view showing still another example of the construction of the main portion of the pickup device in the die bonder shown in FIG. 11, FIG. 23A is a side view showing the semiconductor chip pickup jig and FIG. 23B is a top view showing the semiconductor chip pickup jig.

In the fourth embodiment, the front end portion of the second thrust pin group 24b in the third embodiment is set to the same height as the front end portion of the first thrust pin group 24a and the front end portion of the third thrust pin group 24c is set lower than the front end portion of each of the first and second thrust pin groups 24a, 24b by zz5 (0.05 to 0.6 mm).

Since the other basic structure is the same as that of the third embodiment, portions of the present embodiment which are the same as those of the third embodiment are denoted by the same reference numerals and the detail explanation thereof is omitted.

With this structure, the nearby portion of the central portion of the semiconductor chip 1 is kept in position by the second thrust pin group 24b when the corner portions are separated by the first thrust pin group 24a. Then, after the respective sides of the semiconductor chip 1 are separated by the third thrust pin group 24c, the nearby portion of the central portion thereof is separated by the second thrust pin group 24b. As a result, basically, like the third embodiment, the semiconductor chip can be separated without causing cracks and substantially the same operation and effect can be attained.

That is, with the above structure, it is possible to attain a semiconductor chip pickup jig, semiconductor chip pickup device and semiconductor chip pickup method which can suppress occurrence of cracks when the semiconductor chip which is made thin is separated from the adhesive sheet.

Further, it is possible to attain a semiconductor device manufacturing apparatus and semiconductor device manufacturing method which can enhance the manufacturing yield and suppress occurrence of cracks when the semiconductor chip 1 which is made thin is separated from the adhesive sheet.

Figure 24:
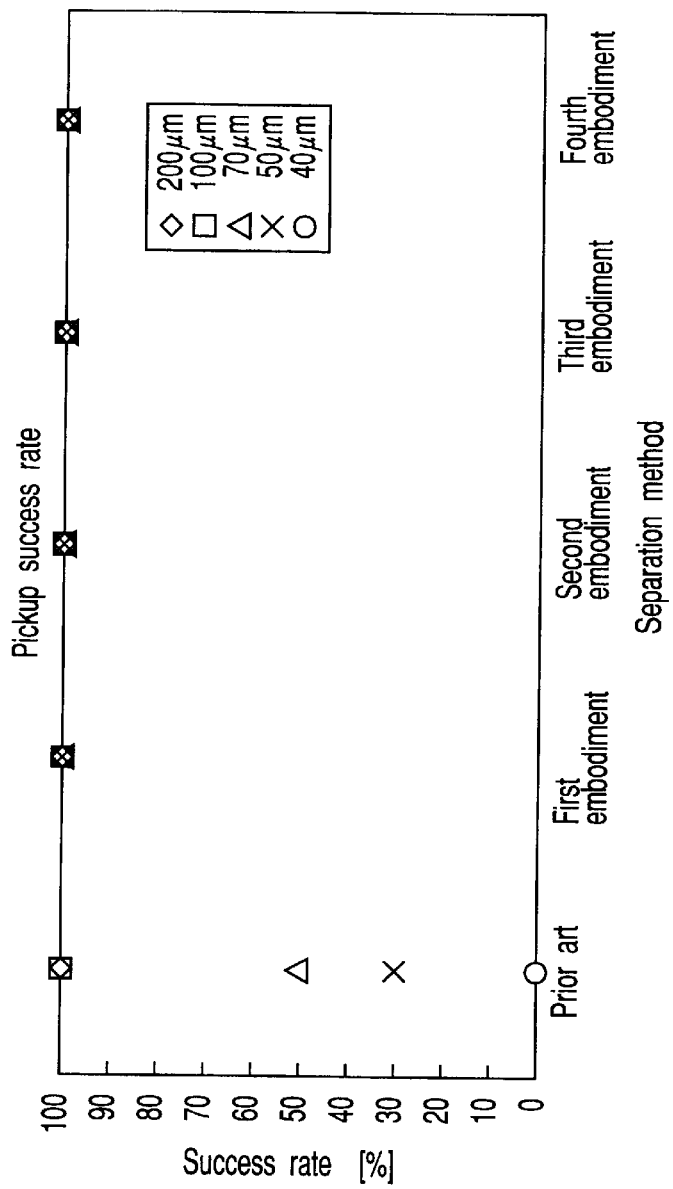
FIG. 24 is a diagram showing the success rate of pickup by use of the pickup device and pickup method according to the first to fourth embodiments of this invention in comparison with that of the conventional case.

FIG. 24 shows the success rate of pickup by use of the pickup device and pickup method according to the first to fourth embodiments of this invention in comparison with that of the conventional case. In the conventional pickup device and pickup method, the success rate is almost 100% when the thickness of the semiconductor chip is approx. 100 $\mu$m or more, but it is lowered to approx. 50% when the thickness is reduced to 70 $\mu$m and it is further lowered to approx. 30% when the thickness is reduced to 50 $\mu$m. When the thickness is reduced to 40 $\mu$m, the success rate becomes 0%, that is, it is almost impossible to separate the semiconductor chip without causing cracks.

On the other hand, the inventor of this application confirms by experiments that the success rate is almost 100% when the thickness of the semiconductor chip is approx. 40 $\mu$m or more in the case of the pickup device and pickup method according to the first to fourth embodiments.

[Fifth Embodiment]

Figure 25:
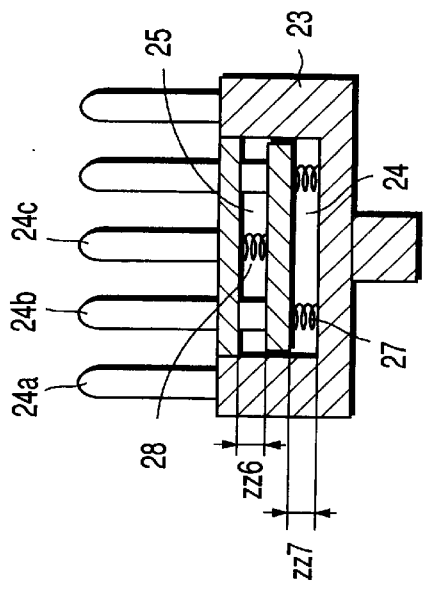
FIG. 25 is a cross sectional view showing a semiconductor chip pickup jig, for illustrating a semiconductor device manufacturing apparatus, semiconductor chip pickup device and semiconductor chip pickup jig according to a fifth embodiment of this invention.

FIG. 25 is a cross sectional view showing a semiconductor chip pickup jig, for illustrating a semiconductor device manufacturing apparatus, semiconductor chip pickup device and semiconductor chip pickup jig according to a fifth embodiment of this invention.

A pin holder 23 according to the fifth embodiment includes receiving sections 25, 26 which receive at least base portions of second and third thrust pin groups 24b, 24c. In the receiving sections 25, 26, elastic members 27, 28 formed of springs or rubber are provided. When the front end portions of the thrust pin groups 24b, 24c are brought into contact with an adhesive sheet 22, the base portions of the thrust pin groups 24b, 24c are received into the receiving sections 25, 26 so as to set the front end portions thereof lower than the front end portions of a thrust pin group 24a. In this case, zz7=zz3 and zz6+zz7=zz4.

Figure 26A:
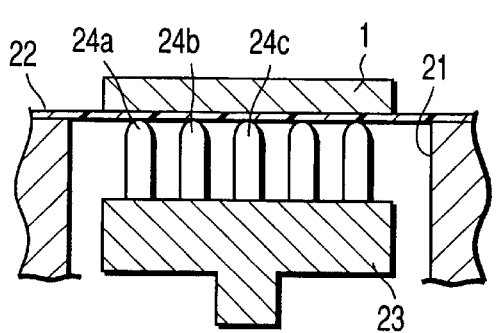
FIG. 26A is a cross sectional view showing a first step, for illustrating the semiconductor chip pickup method according to the fifth embodiment of this invention.
Figure 26B:
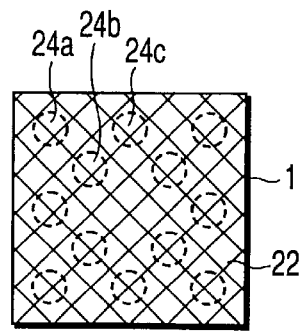
FIG. 26B is a perspective view showing the semiconductor chip in the first step as viewed from above, for illustrating the semiconductor chip pickup method according to the fifth embodiment of this invention.
Figure 27A:
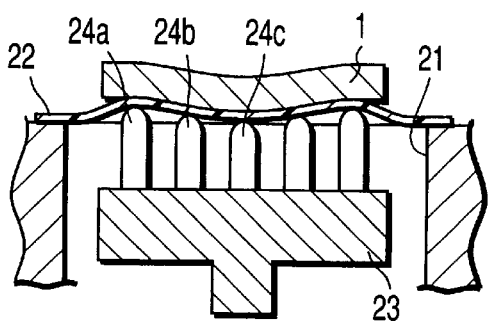
FIG. 27A is a cross sectional view showing a second step, for illustrating the semiconductor chip pickup method according to the fifth embodiment of this invention.
Figure 27B:
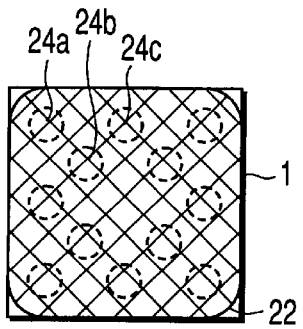
FIG. 27B is a perspective view showing the semiconductor chip in the second step as viewed from above, for illustrating the semiconductor chip pickup method according to the fifth embodiment of this invention.
Figure 28A:
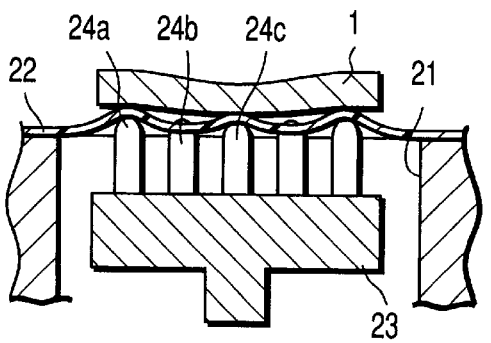
FIG. 28A is a cross sectional view showing a third step, for illustrating the semiconductor chip pickup method according to the fifth embodiment of this invention.
Figure 28B:
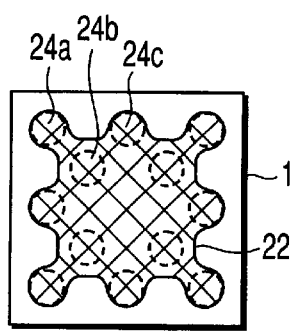
FIG. 28B is a perspective view showing the semiconductor chip in the third step as viewed from above, for illustrating the semiconductor chip pickup method according to the fifth embodiment of this invention.

FIGS. 26A and 26B to FIGS. 29A and 29B respectively show steps of separating the semiconductor chip 1 from the adhesive sheet 22 by use of the pickup jig shown in FIG. 14, for illustrating the semiconductor chip pickup method according to the fifth embodiment of this invention. As shown in FIGS. 26A and 26B, the front end portions of the thrust pin groups 24a, 24b, 24c are brought into contact with the adhesive sheet 22 at the starting time of separation, and the base portions of the thrust pin groups 24b, 24c are received into the receiving sections 25, 26 according as the semiconductor chip 1 is bent by the thrust operation to cause a difference in the heights of the front end portions. Thus, the same pickup operation as those shown in FIGS. 18A and 18B to 21A and 21B is effected.

Like FIGS. 18B, 19B, 20B and 21B, FIGS. 26B, 27B, 28B and 29B are perspective views of the semiconductor chip 1 as viewed from above and the contact surface between the semiconductor chip 1 and the adhesive sheet 22 is indicated by a mesh pattern so that the process of separation of the semiconductor chip 1 from the adhesive sheet 22 can be easily understood.

According to the above structure and method, the same operation and effect as those of the above embodiments can be attained. Further, since stresses caused when the front end portions of the thrust pin groups 24b, 24c are brought into contact with the adhesive sheet 22 and at the time of separation can be reduced by use of the elastic members 27, 28, occurrence of cracks can be more effectively suppressed.

[Sixth Embodiment]

FIG. 30 is a cross sectional view showing a semiconductor chip pickup jig, for illustrating a semiconductor device manufacturing apparatus, semiconductor chip pickup device and semiconductor chip pickup jig according to a sixth embodiment of this invention.

A pin holder 23 according to the sixth embodiment includes a receiving section 25 which receives at least base portions of a third thrust pin group 24c. In the receiving section 25, an elastic member 28 formed of a spring or rubber is provided. When the front end portions of the thrust pin group 24c are brought into contact with an adhesive sheet 22, the base portions of the thrust pin group 24c are received into the receiving section 25 so as to set the front end portions thereof lower than the front end portions of the other thrust pin groups. In this case, zz8=zz5.

With the above structure, the same operation and effect as those of the fifth embodiment can be attained.

In the fifth and sixth embodiments, a case wherein three types of thrust pin groups, that is, the group 24a of thrust pins arranged in positions corresponding to the corner portions of the semiconductor chip 1, the group 24b of thrust pins arranged in positions corresponding to a portion near the central portion thereof, and the group 24c of thrust pins arranged in positions corresponding to the respective sides of the semiconductor chip 1 and lying between the thrust pins of the first thrust pin group 24a are used is explained as an example. However, the above embodiments can also be applied to the pin holder having two types of thrust pin groups as explained in the first and second embodiments.

[Seventh Embodiment]

FIG. 31 is a cross sectional view showing a semiconductor chip pickup jig, for illustrating a semiconductor device manufacturing apparatus, semiconductor chip pickup device and semiconductor chip pickup jig according to a seventh embodiment of this invention.

In the fifth and sixth embodiments, the positions of the front end portions of the thrust pins are controlled by use of the elastic member, but in the seventh embodiment, a pin driving motor 30 which vertically drives the base portions of second and third thrust pin groups 24b, 24c received in receiving sections 24, 25 and a motor control device 31 which controls the driving motor 30 are provided. At the time of pickup of a semiconductor chip 1, the front end portions of the thrust pin group 24b are controlled to be set lower than the front end portions of the thrust pin group 24a and the front end portions of the thrust pin group 24c are controlled to be set lower than the front end portions of the thrust pin group 24b by use of the motor control device 31 and driving motor 30.

With the above construction, it is of course possible to attain the same operation and effect as those of the fifth embodiment. In addition, a more preferable pickup process can be performed by controlling the thrust pins of the groups 24b, 24c according to the separation state of the semiconductor chip 1 and the size and thickness thereof.

In the present embodiment, start timing of the thrust operations of the second and third thrust pin groups 24b, 24c can be freely set. Therefore, the final position of the front end portion of the second thrust pin group 24b may be set substantially equal in height to the position of the front end portion of the first thrust pin group 24a if the thrusting operation by the second thrust pin group 24b is effected after the thrusting operation by the first thrust pin group 24a. Further, the final position of the front end portion of the third thrust pin group 24c may be set substantially equal in height to the position of the front end portion of the second thrust pin group 24b if the thrusting operation by the third thrust pin group 24c is effected after the thrusting operation by the second thrust pin group 24b.

[Eighth Embodiment]

FIG. 32 is a cross sectional view showing a semiconductor chip pickup jig, for illustrating a semiconductor device manufacturing apparatus, semiconductor chip pickup device and semiconductor chip pickup jig according to an eighth embodiment of this invention.

In the eighth embodiment, like the seventh embodiment, a pin driving motor 30 which vertically drives the base portions of thrust pins of a third group 24c received in a receiving section and a motor control device 31 which controls the driving motor 30 are provided. At the time of pickup of a semiconductor chip 1, the front end portions of the thrust pin group 24c are controlled to be set lower than the front end portions of the thrust pin groups 24a, 24b by use of the motor control device 31 and driving motor 30.

With the above construction, it is of course possible to attain the same operation and effect as those of the sixth embodiment. In addition, like the seventh embodiment, a more preferable pickup process can be performed by controlling the thrust pin group 24c according to the separation state of the semiconductor chip 1 and the size and thickness thereof.

In the present embodiment, start timing of the thrust operation of the third thrust pin group 24c can be freely set. Therefore, the final position of the front end portion of the third thrust pin group 24c may be set substantially equal in height to the position of the front end portions of the first and second thrust pin groups 24a, 24b if the thrusting operation by the third thrust pin group 24c is effected after the thrusting operations by the first and second thrust pin groups 24a, 24b.

In the seventh and eighth embodiments, a case wherein three types of thrust pin groups, that is, the group 24a of thrust pins arranged in positions corresponding to the corner portions of the semiconductor chip 1, the group 24b of thrust pins arranged in positions corresponding to a portion near the central portion thereof, and the group 24c of thrust pins arranged in positions corresponding to the respective sides of the semiconductor chip 1 and lying between the thrust pins of the group 24a are used is explained as an example. However, the above embodiments can also be applied to the pin holder 23 having two types of thrust pin groups as explained in the first and second embodiments.

[Ninth Embodiment]

Figure 33:
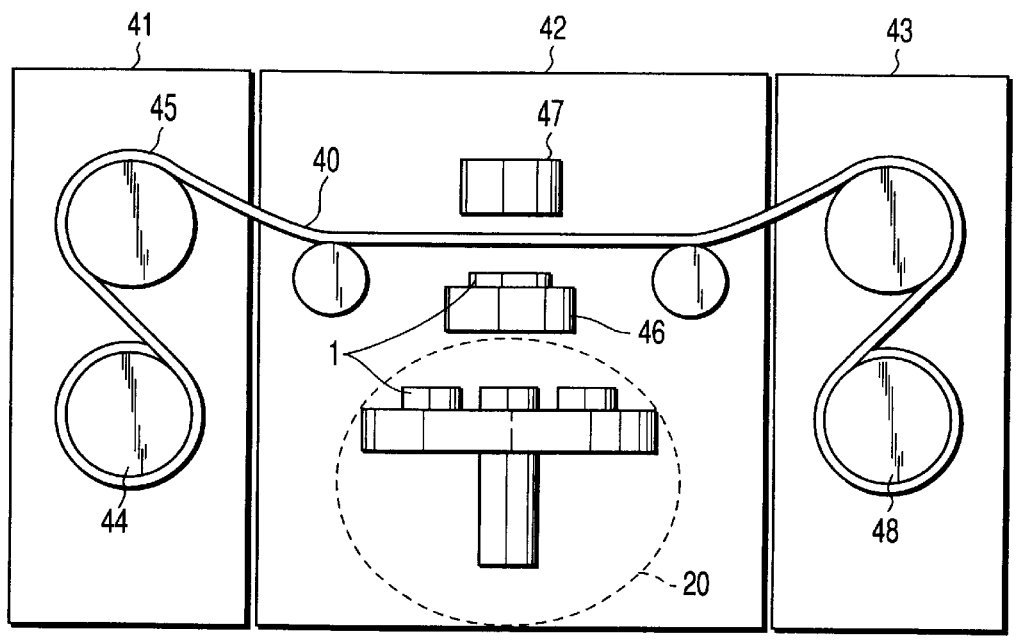
FIG. 33 is a view showing the schematic construction of an inner lead bonder, for illustrating a semiconductor chip pickup jig, semiconductor chip pickup device, semiconductor chip pickup method, semiconductor device manufacturing method and semiconductor device manufacturing apparatus according to a ninth embodiment of this invention.

FIG. 33 is a view showing the schematic construction of an inner lead bonder, for illustrating a semiconductor chip pickup jig, semiconductor chip pickup device, semiconductor chip pickup method, semiconductor device manufacturing method and semiconductor device manufacturing apparatus according to a ninth embodiment of this invention.

The inner lead bonder includes a feed mechanism 41 which supplies a TAB tape 40, an inner lead bonding mechanism 42 and a receiving mechanism 43 which receives the TAB tape 40. The TAB tape 40 wound on a reel 44 is received in the feed mechanism 41 and fed out to the inner lead bonding mechanism 42 via a feed roller 45. The inner lead bonding mechanism 42 includes a pickup device 20, stage 46 and heating tool 47. A semiconductor chip picked up by the pickup device 20 is placed on the stage 46 and heated by the heating tool 47 with the TAB tape 40 disposed between the semiconductor chip 1 and the heating tool so as to be subjected to the inner lead bonding process. Then, the TAB tape 40 on which the semiconductor chip 1 is bonded by thermocompression is taken up by a reel 48 in the receiving mechanism 43.

As the pickup device 20 used in the inner lead bonder shown in FIG. 33, the pickup device with any type of structure described in each of the above embodiments can be applied.

[Tenth Embodiment]

Figure 34:
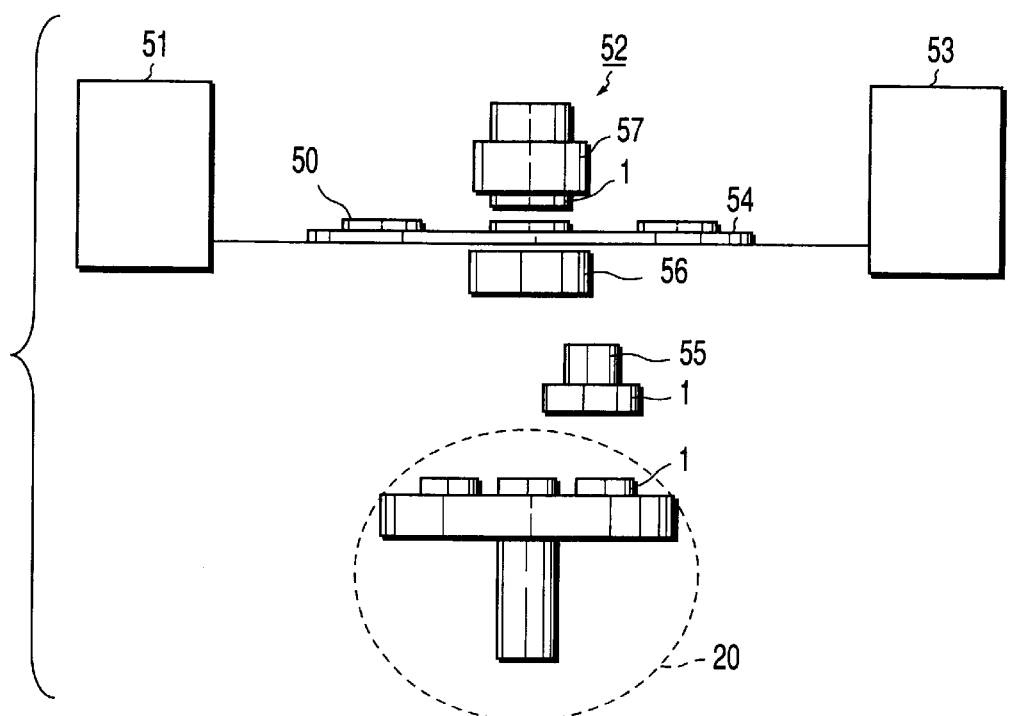
FIG. 34 is a view showing the schematic construction of a flip chip bonder, for illustrating a semiconductor chip pickup jig, semiconductor chip pickup device, semiconductor chip pickup method, semiconductor device manufacturing method and semiconductor device manufacturing apparatus according to a tenth embodiment of this invention.

FIG. 34 is a view showing the schematic construction of a flip chip bonder, for illustrating a semiconductor chip pickup jig, semiconductor chip pickup device, semiconductor chip pickup method, semiconductor device manufacturing method and semiconductor device manufacturing apparatus according to a tenth embodiment of this invention.

The flip chip bonder includes a feed mechanism 51 which supplies a film substrate 50, a flip chip bonding mechanism 52 and a receiving mechanism 53 which receives the film substrate 50. The feed mechanism 51 supplies the film substrate 50 set on a feed jig 54 to the flip chip bonding mechanism 52. The flip chip bonding mechanism 52 includes a pickup device 20, chip reversing stage 55, stage 56 and heating tool 57. A semiconductor chip 1 picked up by the pickup device 20 is turned over in the chip reversing stage 55 and then placed on the stage 56. After this, the semiconductor chip is heated from above by use of the heating tool 57 to perform the flip chip connection process.

Then, the film substrate 50 having the semiconductor chip 1 mounted thereon is received into the receiving mechanism 53.

As the pickup device 20 used in the flip chip bonder shown in FIG. 34, the pickup device with any type of structure described in each of the above embodiments can be applied.

Further, the semiconductor device manufacturing apparatus is applied to the die bonder, inner lead bonder and flip chip bonder in the above embodiments. Of course, the above manufacturing apparatus can also be applied to any other device which picks up a semiconductor chip from an adhesive sheet, for example, an LOC mounter, CSP mounter or picker which packs the picked-up semiconductor chip into a tray, or a semiconductor package sorter which separates a semiconductor package (which is a packaged semiconductor chip) from an adhesive sheet.

In the pickup device and semiconductor device manufacturing apparatus according to the above embodiments, if a semiconductor chip pickup jig is removably mounted and selected according to the size and thickness of a semiconductor chip to be picked up and the adhesive strength of an adhesive sheet, occurrence of cracks can be more effectively suppressed and the manufacturing yield can be further enhanced.

Likewise, in the pickup method and semiconductor device manufacturing method according to the above embodiments, if a step of previously selecting a semiconductor chip pickup jig according to the size and thickness of a semiconductor chip to be picked up and the adhesive strength of an adhesive sheet is additionally provided, occurrence of cracks can be more effectively suppressed and the manufacturing yield can be further enhanced.

As described above, according to one aspect of this invention, it is possible to provide a semiconductor chip pickup jig, semiconductor chip pickup device and semiconductor chip pickup method which can suppress occurrence of cracks when the semiconductor chip which is made thin is separated from the adhesive sheet.

Further, it is possible to provide a semiconductor device manufacturing apparatus and semiconductor device manufacturing method which can enhance the manufacturing yield and suppress occurrence of cracks when the semiconductor chip which is made thin is separated from the adhesive sheet.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor chip pickup jig which separates semiconductor chips removably affixed to an adhesive sheet from said adhesive sheet comprising:
   a first group of thrust pins which are arranged in positions corresponding to corner portions of one of said semiconductor chips and thrust up said semiconductor chip by use of first front end portions thereof with said adhesive sheet disposed therebetween;
   a second group of thrust pins which are arranged in positions corresponding to a nearby portion of a central portion of said semiconductor chip with second front end portions thereof being set lower than said first front end portions of said first group of thrust pins and thrust up said semiconductor chip by use of said second front end portions thereof with said adhesive sheet disposed therebetween; and a pin holder on which base portions of said first and second thrust pin groups are mounted.

2. The semiconductor chip pickup jig according to claim 1, further comprising a third group of thrust pins whose base portions are mounted on said pin holder, whose third front end portions are set lower than said second front end portions of said second thrust pin group and which are arranged in positions corresponding to respective sides of said semiconductor chip and lying between said thrust pins of said first thrust pin group and thrust up said semiconductor chip by use of said third front end portions with said adhesive sheet disposed therebetween.

3. A semiconductor chip pickup jig which separates semiconductor chips removably affixed to an adhesive sheet from said adhesive sheet comprising:

a first group of thrust pins which are arranged in positions corresponding to corner portions of one of said semiconductor chips and thrust up said semiconductor chip by use of first front end portions thereof with said adhesive sheet disposed therebetween;

a second group of thrust pins which are arranged in positions corresponding to a nearby portion of a central portion of said semiconductor chip with second front end portions thereof being set at substantially the same height as said first front end portions of said first thrust pin group and thrust up said semiconductor chip by use of said second front end portions thereof with said adhesive sheet disposed therebetween;

a third group of thrust pins which are arranged in positions corresponding to respective sides of said semiconductor chip and lying between said thrust pins of said first thrust pin group with third front end portions thereof being set lower than said first and second front end portions of said first and second thrust pin groups and thrust up said semiconductor chip by use of said third front end portions thereof with said adhesive sheet disposed therebetween; and a pin holder on which base portions of said first to third thrust pin groups are mounted.

4. A semiconductor chip pickup jig which separates semiconductor chips removably affixed to an adhesive sheet from said adhesive sheet comprising:

a first group of thrust pins which are arranged in positions corresponding to corner portions of one of said semiconductor chips and thrust up said semiconductor chip by use of first front end portions thereof with said adhesive sheet disposed therebetween;

a second group of thrust pins which are arranged in positions corresponding to a nearby portion of a central portion of said semiconductor chip and thrust up said semiconductor chip by use of second front end portions thereof with said adhesive sheet disposed therebetween;

a pin holder on which base portions of said first and second thrust pin groups are mounted; and a pin position controller which controls said second front end portions of said second thrust pin group to be set lower than said first front end portions of said first thrust pin group at the time of separation of said semiconductor chip.

5. The semiconductor chip pickup jig according to claim 4, wherein said pin holder includes a receiving section which receives at least said base portions of said second thrust pin group and said pin position controller is an elastic member which is received in said receiving section and permits said base portions of said second thrust pin group to be received into said receiving section thereby to set said second front end portions of said second thrust pin group lower than said first front end portions of said first thrust pin group when said second front end portions of said second thrust pin group are brought into contact with said adhesive sheet.

6. The semiconductor chip pickup jig according to claim 4, wherein said pin holder includes a receiving section which receives at least said base portions of said second thrust pin group and said pin position controller includes a pin drive mechanism which vertically drives said second thrust pin group from said receiving section and a controller which controls said pin drive mechanism, and said second front end portions of said second thrust pin group are controlled to be set lower than said first front end portions of said first thrust pin group by use of said controller and pin drive mechanism when said semiconductor chip is picked up.

7. The semiconductor chip pickup jig according to claim 4, which further comprises a third group of thrust pins whose base portions are mounted on said pin holder and which are arranged in positions corresponding to respective sides of said semiconductor chip and lying between said thrust pins of said first thrust pin group and thrust up said semiconductor chip by use of third front end portions thereof with said adhesive sheet disposed therebetween and in which said pin position controller sets said second front end portions of said second thrust pin group lower than said first front end portions of said first thrust pin group and sets said third front end portions of said third thrust pin group lower than said second front end portions of said second thrust pin group when said semiconductor chip is separated.

8. The semiconductor chip pickup jig according to claim 7, wherein said pin holder includes a receiving section which receives at least said base portions of said second and third thrust pin groups and said pin position controller is an elastic member which is received in said receiving section and permits said base portions of said second and third thrust pin groups to be received into said receiving section thereby to set said second front end portions of said second thrust pin group lower than said first front end portions of said first thrust pin group and set said third front end portions of said third thrust pin group lower than said second front end portions of said second thrust pin group when said second and third front end portions of said second and third thrust pin groups are brought into contact with said adhesive sheet.

9. The semiconductor chip pickup jig according to claim 7, wherein said pin holder includes a receiving section which receives at least said base portions of said second and third thrust pin groups and said pin position controller includes a pin drive mechanism which vertically drives said second and third thrust pin groups from said receiving section and a controller which controls said pin drive mechanism, and said second front end portions of said second thrust pin group are controlled to be set lower than said first front end portions of said first thrust pin group and said third front end portions of said third thrust pin group are controlled to be set lower than said second front end portions of said second thrust pin group by use of said controller and pin drive mechanism when said semiconductor chip is picked up.

10. The semiconductor chip pickup jig according to claim 4, which further comprises a third group of thrust pins whose base portions are mounted on said pin holder and which are arranged in positions corresponding to respective sides of said semiconductor chip and lying between said thrust pins of said first thrust pin group and thrust up said semiconductor chip by use of third front end portions thereof with said adhesive sheet disposed therebetween and in which said pin position controller sets said third front end portions of said third thrust pin group lower than said second front end portions of said second thrust pin group when said semiconductor chip is separated.

11. The semiconductor chip pickup jig according to claim 10, wherein said pin holder includes a receiving section which receives at least said base portions of said third thrust pin group and said pin position controller is an elastic member which is received in said receiving section and permits said base portions of said third thrust pin group to be received into said receiving section thereby to set said third front end portions of said third thrust pin group lower than said first and second front end portions of said first and second thrust pin groups when said third front end portions of said third thrust pin group are brought into contact with said adhesive sheet.

12. The semiconductor chip pickup jig according to claim 10, wherein said pin holder includes a receiving section which receives at least said base portions of said third thrust pin group and said pin position controller includes a pin drive mechanism which vertically drives said third thrust pin group from said receiving section and a controller which controls said pin drive mechanism, and said third front end portions of said third thrust pin group are controlled to be set lower than said first and second front end portions of said first and second thrust pin groups by use of said controller and pin drive mechanism when said semiconductor chip is picked up.

13. A semiconductor chip pickup device which individually separates a plurality of semiconductor chips formed by discretely dividing a semiconductor wafer and removably affixed to a first surface of an adhesive sheet from said adhesive sheet comprising:
  a fixing table on which said plurality of semiconductor chips are fixedly set with said semiconductor chips affixed to said adhesive sheet;
  a first group of thrust pins which are arranged in positions corresponding to corner portions of one of said semiconductor chips and thrust up said semiconductor chip by use of first front end portions thereof with said adhesive sheet disposed therebetween;
  a second group of thrust pins which are arranged in positions corresponding to a nearby portion of a central portion of said semiconductor chip with second front end portions thereof being set lower than said first front end portions of said first thrust pin group and thrust up said semiconductor chip by use of said second front end portions thereof with said adhesive sheet disposed therebetween;
  a pin holder on which base portions of said first and second thrust pin groups are mounted;
  a backup holder in which said pin holder having said first and second thrust pin groups mounted thereon is received and which is arranged on a second surface of said adhesive sheet opposite to said first surface;
  a moving mechanism which is constructed to relatively move said position of each semiconductor chip on said fixing table and said position of said backup holder; and
  a suction device which is constructed to fix said adhesive sheet to which said semiconductor chip to be picked up is affixed by drawing a vacuum on the inside of said backup holder;
  wherein said respective corner portions of said semiconductor chip are separated by use of said first thrust pin group and then said nearby portion of said central portion of said semiconductor chip is separated by use of said second thrust pin group.

14. The semiconductor chip pickup device according to claim 13, wherein said pin holder is removably mounted and selected according to at least one of the size and thickness of said semiconductor chip to be picked up.

15. The semiconductor chip pickup device according to claim 13, further comprising a third group of thrust pins whose base portions are mounted on said pin holder and which are arranged in positions corresponding to respective sides of said semiconductor chip and lying between said thrust pins of said first thrust pin group with third front end portions thereof being set lower than said second front end portions of said second thrust pin group and thrust up said semiconductor chip by use of said third front end portions thereof with said adhesive sheet disposed therebetween;
  wherein said respective corner portions of said semiconductor chip are separated by use of said first thrust pin group, then the respective sides of said semiconductor chip are separated by use of said third thrust pin group while said nearby portion of said central portion of said semiconductor chip is kept in position by use of said second thrust pin group, and after this, said nearby portion of said central portion of said semiconductor chip is separated by use of said second thrust pin group.

16. The semiconductor chip pickup device according to claim 15, wherein said pin holder is removably mounted and selected according to at least one of the size and thickness of said semiconductor chip to be picked up.

17. A semiconductor chip pickup device which individually separates a plurality of semiconductor chips formed by discretely dividing a semiconductor wafer and removably affixed to a first surface of an adhesive sheet from said adhesive sheet comprising:
  a fixing table on which said plurality of semiconductor chips are fixedly set with said semiconductor chips affixed to said adhesive sheet;
  a first group of thrust pins which are arranged in positions corresponding to corner portions of said semiconductor chip and thrust up said semiconductor chip by use of first front end portions thereof with said adhesive sheet disposed therebetween;
  a second group of thrust pins which are arranged in positions corresponding to a nearby portion of a central portion of said semiconductor chip with second front end portions thereof being set at substantially the same height as said first front end portions of said first thrust pin group and thrust up said semiconductor chip by use of said second front end portions thereof with said adhesive sheet disposed therebetween;
  a third group of thrust pins which are arranged in positions corresponding to respective sides of said semiconductor chip and lying between said thrust pins of said first thrust pin group with third front end portions thereof being set lower than said first and second front end portions of said first and second thrust pin groups and thrust up said semiconductor chip by use of said third front end portions thereof with said adhesive sheet disposed therebetween;
  a pin holder on which base portions of said first to third thrust pin groups are mounted;
  a backup holder in which said pin holder having said first to third thrust pin groups mounted thereon is received and which is arranged on a second surface of said adhesive sheet opposite to said first surface;

a moving mechanism which is constructed to relatively move said position of each semiconductor chip on said fixing table and said position of said backup holder; and a suction device which is constructed to fix said adhesive sheet to which said semiconductor chip to be picked up is affixed by drawing a vacuum on the inside of said backup holder;

wherein said respective corner portions of said semiconductor chip are separated by use of said first thrust pin group while said nearby portion of said central portion of said semiconductor chip is kept in position by use of said second thrust pin group, then said respective sides of said semiconductor chip are separated by use of said third thrust pin group, and after this, said nearby portion of said central portion of said semiconductor chip is separated by use of said second thrust pin group.

18. The semiconductor chip pickup device according to claim 17, wherein said pin holder is removably mounted and selected according to at least one of the size and thickness of said semiconductor chip to be picked up.

19. A semiconductor chip pickup device which individually separates a plurality of semiconductor chips formed by discretely dividing a semiconductor wafer and removably affixed to a first surface of an adhesive sheet from said adhesive sheet comprising:

a fixing table on which said plurality of semiconductor chips are fixedly set with said semiconductor chips affixed to said adhesive sheet;

a first group of thrust pins which are arranged in positions corresponding to corner portions of said semiconductor chip and thrust up said semiconductor chip by use of first front end portions thereof with said adhesive sheet disposed therebetween;

a second group of thrust pins which are arranged in positions corresponding to a nearby portion of a central portion of said semiconductor chip and thrust up said semiconductor chip by use of second front end portions thereof with said adhesive sheet disposed therebetween;

a pin holder on which base portions of said first and second thrust pin groups are mounted;

a backup holder in which said pin holder having said first and second thrust pin groups mounted thereon is received and which is arranged on a second surface of said adhesive sheet opposite to said first surface;

a moving mechanism which is constructed to relatively move said position of each semiconductor chip on said fixing table and said position of said backup holder;

a suction device which is constructed to fix said adhesive sheet to which said semiconductor chip to be picked up is affixed by drawing a vacuum on the inside of said backup holder; and a pin position controller which controls said front end portions of said second thrust pin group to be set lower than said first front end portions of said first thrust pin group at the time of separation of said semiconductor chip;

wherein said respective corner portions of said semiconductor chip are separated by use of said first thrust pin group and then said nearby portion of said central portion of said semiconductor chip is separated by use of said second thrust pin group.

20. The semiconductor chip pickup device according to claim 19, wherein said pin holder is removably mounted and selected according to at least one of the size and thickness of said semiconductor chip to be picked up.

21. The semiconductor chip pickup device according to claim 19, wherein said pin holder includes a receiving section which receives at least said base portions of said second thrust pin group and said pin position controller is an elastic member which is received in said receiving section and permits said base portions of said second thrust pin group to be received into said receiving section thereby to set said second front end portions of said second thrust pin group lower than said first front end portions of said first thrust pin group when said second front end portions of said second thrust pin group are brought into contact with said adhesive sheet.

22. The semiconductor chip pickup device according to claim 19, wherein said pin holder includes a receiving section which receives at least said base portions of said second thrust pin group and said pin position controller includes a pin drive mechanism which vertically drives said second thrust pin group from said receiving section and a controller which controls said pin drive mechanism, and said second front end portions of said second thrust pin group are controlled to be set lower than said first front end portions of said first thrust pin group by use of said controller and pin drive mechanism when said semiconductor chip is picked up.

23. The semiconductor chip pickup device according to claim 19, which further comprises a third group of thrust pins whose base portions are mounted on said pin holder and which are arranged in positions corresponding to respective sides of said semiconductor chip and lying between said thrust pins of said first thrust pin group and thrust up said semiconductor chip by use of third front end portions thereof with said adhesive sheet disposed therebetween and in which said pin position controller sets said second front end portions of said second thrust pin group lower than said first front end portions of said first thrust pin group and sets said third front end portions of said third thrust pin group lower than said second front end portions of said second thrust pin group when said semiconductor chip is separated;

wherein said respective corner portions of said semiconductor chip are separated by use of said first thrust pin group, then the respective sides of said semiconductor chip are separated by use of said third thrust pin group while said nearby portion of said central portion of said semiconductor chip is kept in position by use of said second thrust pin group, and after this, said nearby portion of said central portion of said semiconductor chip is separated by use of said second thrust pin group.

24. The semiconductor chip pickup device according to claim 23, wherein said pin holder is removably mounted and selected according to at least one of the size and thickness of said semiconductor chip to be picked up.

25. The semiconductor chip pickup device according to claim 23, wherein said pin holder includes a receiving section which receives at least said base portions of said second and third thrust pin groups and said pin position controller includes a pin drive mechanism which vertically drives said second and third thrust pin groups from said receiving section and a controller which controls said pin drive mechanism, and said second front end portions of said second thrust pin group are controlled to be set lower than said first front end portions of said first thrust pin group and said third front end portions of said third thrust pin group are controlled to be set lower than said second front end portions of said second thrust pin group by use of said controller and pin drive mechanism when said semiconductor chip is picked up.

26. The semiconductor chip pickup device according to claim 23, wherein said pin holder includes a receiving section which receives at least said base portions of said second and third thrust pin groups and said pin position controller is an elastic member which is received in said receiving section and permits said base portions of said second and third thrust pin group to be received into said receiving section thereby to set said second front end portions of said second thrust pin group lower than said first front end portions of said first thrust pin group and set said third front end portions of said third thrust pin group lower than said second front end portions of said second thrust pin group when said second front end portions of said second and third thrust pin groups are brought into contact with said adhesive sheet.

27. The semiconductor chip pickup device according to claim 19, which further comprises a third group of thrust pins whose base portions are mounted on said pin holder and which are arranged in positions corresponding to respective sides of said semiconductor chip and lying between said thrust pins of said first thrust pin group and thrust up said semiconductor chip by use of third front end portions thereof with said adhesive sheet disposed therebetween and in which said pin position controller sets said third front end portions of said third thrust pin group lower than said first and second front end portions of said first and second thrust pin groups when said semiconductor chip is separated;

wherein said corner portions of said semiconductor chip are separated by use of said first thrust pin group while said nearby portion of said central portion of said semiconductor chip is kept in position by use of said second thrust pin group, then the respective sides of said semiconductor chip are separated by use of said third thrust pin group, and after this, said nearby portion of said central portion of said semiconductor chip is separated by use of said second thrust pin group.

28. The semiconductor chip pickup device according to claim 27, wherein said pin holder is removably mounted and selected according to at least one of the size and thickness of said semiconductor chip to be picked up.

29. The semiconductor chip pickup device according to claim 27, wherein said pin holder includes a receiving section which receives at least said base portions of said third thrust pin group and said pin position controller is an elastic member which is received in said receiving section and permits said base portions of said third thrust pin group to be received into said receiving section thereby to set said third front end portions of said third thrust pin group lower than said first and second front end portions of said first and second thrust pin groups when said third front end portions of said third thrust pin group are brought into contact with said adhesive sheet.

30. The semiconductor chip pickup device according to claim 27, wherein said pin holder includes a receiving section which receives at least said base portions of said third thrust pin group and said pin position controller includes a pin drive mechanism which vertically drives said third thrust pin group from said receiving section and a controller which controls said pin drive mechanism, and said third front end portions of said third thrust pin group are controlled to be set lower than said first and second front end portions of said first and second thrust pin groups by use of said controller and pin drive mechanism when said semiconductor chip is picked up.

31. A semiconductor device manufacturing apparatus comprising:

a semiconductor chip pickup device which individually separates a plurality of semiconductor chips formed by discretely dividing a semiconductor wafer and removably affixed to a first surface of an adhesive sheet from said adhesive sheet;

said pickup device including:
a fixing table on which said plurality of semiconductor chips are fixedly set with said semiconductor chips affixed to said adhesive sheet;
a first group of thrust pins which are arranged in positions corresponding to corner portions of said semiconductor chip and thrust up said semiconductor chip by use of first front end portions thereof with said adhesive sheet disposed therebetween;
a second group of thrust pins which are arranged in positions corresponding to a nearby portion of a central portion of said semiconductor chip with second front end portions thereof being set lower than said first front end portions of said first thrust pin group and thrust up said semiconductor chip by use of said second front end portions thereof with said adhesive sheet disposed therebetween;
a pin holder on which base portions of said first and second thrust pin groups are mounted;
a backup holder in which said pin holder having said first and second thrust pin groups mounted thereon is received and which is arranged on a second surface of said adhesive sheet opposite to said first surface;
a moving mechanism which is constructed to relatively move the position of each semiconductor chip on said fixing table and the position of said backup holder; and
a suction device which is constructed to fix said adhesive sheet to which said semiconductor chip to be picked up is affixed by drawing a vacuum on the inside of said backup holder;

wherein said respective corner portions of said semiconductor chip are separated by use of said first thrust pin group and then said nearby portion of said central portion of said semiconductor chip is separated by use of said second thrust pin group.

32. The semiconductor device manufacturing apparatus according to claim 31, wherein said pickup device further comprises a third group of thrust pins whose base portions are mounted on said pin holder and which are arranged in positions corresponding to respective sides of said semiconductor chip and lying between said thrust pins of said first thrust pin group with third front end portions thereof being set lower than said second front end portions of said second thrust pin group and thrust up said semiconductor chip by use of said third front end portions thereof with said adhesive sheet disposed therebetween;

wherein said corner portions of said semiconductor chip are separated by use of said first thrust pin group, then the respective sides of said semiconductor chip are separated by use of said third thrust pin group while said nearby portion of said central portion of said semiconductor chip is kept in position by use of said second thrust pin group, and after this, said nearby portion of said central portion of said semiconductor chip is separated by use of said second thrust pin group.

33. A semiconductor device manufacturing apparatus comprising:

a semiconductor chip pickup device which individually separates a plurality of semiconductor chips formed by discretely dividing a semiconductor wafer and removably affixed to a first surface of an adhesive sheet from said adhesive sheet;

said pickup device including:
a fixing table on which said plurality of semiconductor chips are fixedly set with said semiconductor chips affixed to said adhesive sheet;
a first group of thrust pins which are arranged in positions corresponding to corner portions of said semiconductor chip and thrust up said semiconductor chip by use of first front end portions thereof with said adhesive sheet disposed therebetween;
a second group of thrust pins which are arranged in positions corresponding to a nearby portion of a central portion of said semiconductor chip with second front end portions thereof being set at substantially the same height as said first front end portions of said first thrust pin group and thrust up said semiconductor chip by use of said second front end portions thereof with said adhesive sheet disposed therebetween;
a third group of thrust pins which are arranged in positions corresponding to respective sides of said semiconductor chip and lying between said thrust pins of said first thrust pin group with third front end portions thereof being set lower than said first and second front end portions of said first and second thrust pin groups and thrust up said semiconductor chip by use of said third front end portions thereof with said adhesive sheet disposed therebetween;
a pin holder on which base portions of said first to third thrust pin groups are mounted;
a backup holder in which said pin holder having said first to third thrust pin groups mounted thereon is received and which is arranged on a second surface of said adhesive sheet opposite to said first surface;
a moving mechanism which is constructed to relatively move the position of each semiconductor chip on said fixing table and the position of said backup holder; and
a suction device which is constructed to fix said adhesive sheet to which said semiconductor chip to be picked up is affixed by drawing a vacuum on the inside of said backup holder;
wherein said respective corner portions of said semiconductor chip are first separated by use of said first thrust pin group while said nearby portion of said central portion of said semiconductor chip is kept in position by use of said second thrust pin group, then the respective sides of said semiconductor chip are separated by use of said third thrust pin group, and after this, said nearby portion of said central portion of said semiconductor chip is separated by use of said second thrust pin group.

34. A semiconductor device manufacturing apparatus comprising:
a semiconductor chip pickup device which individually separates a plurality of semiconductor chips formed by discretely dividing a semiconductor wafer and removably affixed to a first surface of an adhesive sheet from said adhesive sheet;
said pickup device including:
a fixing table on which said plurality of semiconductor chips are fixedly set with said semiconductor chips affixed to said adhesive sheet;
a first group of thrust pins which are arranged in positions corresponding to corner portions of said semiconductor chip and thrust up said semiconductor chip by use of first front end portions thereof with said adhesive sheet disposed therebetween;
a second group of thrust pins which are arranged in positions corresponding to a nearby portion of a central portion of said semiconductor chip and thrust up said semiconductor chip by use of second front end portions thereof with said adhesive sheet disposed therebetween;
a pin holder on which base portions of said first and second thrust pin groups are mounted;
a backup holder in which said pin holder having said first and second thrust pin groups mounted thereon is received and which is arranged on a second surface of said adhesive sheet opposite to said first surface;
a moving mechanism which is constructed to relatively move the position of each semiconductor chip on said fixing table and the position of said backup holder;
a suction device which is constructed to fix said adhesive sheet to which said semiconductor chip to be picked up is affixed by drawing a vacuum on the inside of said backup holder; and
a pin position controller which controls said front end portions of said second thrust pin group to be set lower than said first front end portions of said first thrust pin group at the time of separation of said semiconductor chip;
wherein said respective corner portions of said semiconductor chip are separated by use of said first thrust pin group and then said nearby portion of said central portion of said semiconductor chip is separated by use of said second thrust pin group.

35. The semiconductor device manufacturing apparatus according to claim 34, wherein said pickup device further comprises a third group of thrust pins whose base portions are mounted on said pin holder and which are arranged in positions corresponding to respective sides of said semiconductor chip and lying between said thrust pins of said first thrust pin group and thrust up said semiconductor chip by use of said third front end portions thereof with said adhesive sheet disposed therebetween; and said pin position controller sets said second front end portions of said second thrust pin group lower than said first front end portions of said first thrust pin group and sets said third front end portions of said third thrust pin group lower than said second front end portions of said second thrust pin group when said semiconductor chip is separated;
wherein said corner portions of said semiconductor chip are separated by use of said first thrust pin group, then said respective sides of said semiconductor chip are separated by use of said third thrust pin group while said nearby portion of said central portion of said semiconductor chip is kept in position by use of said second thrust pin group, and after this, said nearby portion of said central portion of said semiconductor chip is separated by use of said second thrust pin group.

36. The semiconductor device manufacturing apparatus according to claim 34, wherein said pickup device further comprises a third group of thrust pins whose base portions are mounted on said pin holder and which are arranged in positions corresponding to respective sides of said semiconductor chip and lying between said thrust pins of said first thrust pin group and thrust up said semiconductor chip by use of said third front end portions thereof with said adhesive sheet disposed therebetween; and said pin position controller sets said third front end portions of said third thrust pin group lower than said first and second front end portions of said first and second thrust pin groups when said semiconductor chip is separated;

wherein said corner portions of said semiconductor chip are separated by use of said first thrust pin group while said nearby portion of said central portion of said semiconductor chip is kept in position by use of said second thrust pin group, then said respective sides of said semiconductor chip are separated by use of said third thrust pin group, and after this, said nearby portion of said central portion of said semiconductor chip is separated by use of said second thrust pin group.

37. A semiconductor chip pickup method which individually separates a plurality of semiconductor chips formed by discretely dividing a semiconductor wafer and affixed to an adhesive sheet from said adhesive sheet comprising:

relatively moving said position of a fixing table and said position of a backup holder to set first and second thrust pin groups to a position corresponding to one of said semiconductor chips which is to be picked up;

separating said corner portions of said semiconductor chip from said adhesive sheet by projecting said first thrust pin group from said backup holder to thrust up said semiconductor chip with said adhesive sheet disposed therebetween and thereby bend said semiconductor chip into a concave shape while drawing a vacuum on the inside of said backup holder to hold said adhesive sheet by suction; and separating a nearby portion of a central portion of said semiconductor chip bent into a concave shape from said adhesive sheet, while holding said nearby portion of said central portion of said semiconductor chip by said second thrust pin group, by projecting said second thrust pin group from said backup holder to a position which is lower than that of said first thrust pin group to thrust up said semiconductor chip with said adhesive sheet disposed therebetween while drawing a vacuum on the inside of said backup holder to hold said adhesive sheet by suction.

38. A semiconductor chip pickup method which individually separates a plurality of semiconductor chips formed by discretely dividing a semiconductor wafer and affixed to an adhesive sheet from said adhesive sheet comprising:

relatively moving said position of a fixing table and said position of a backup holder to set first to third thrust pin groups to a position corresponding to one of said semiconductor chips which is to be picked up;

separating said corner portions of said semiconductor chip from said adhesive sheet by projecting said first thrust pin group from said backup holder to thrust up said semiconductor chip with said adhesive sheet disposed therebetween and thereby bend said semiconductor chip into a concave shape while drawing a vacuum on the inside of said backup holder to hold said adhesive sheet by suction;

keeping a nearby portion of a central portion of said semiconductor chip bent into a concave shape in position by projecting said second thrust pin group from said backup holder to a position which is lower than that of said first thrust pin group to thrust up said semiconductor chip with said adhesive sheet disposed therebetween while drawing a vacuum on the inside of said backup holder to hold said adhesive sheet by suction;

separating respective sides of said semiconductor chip by projecting said third thrust pin group from said backup holder to a position which is lower than that of said second thrust pin group to thrust up said semiconductor chip with said adhesive sheet disposed therebetween while drawing a vacuum on the inside of said backup holder to hold said adhesive sheet by suction; and separating said nearby portion of said central portion of said semiconductor chip by use of said second thrust pin group.

39. A semiconductor chip pickup method which individually separates a plurality of semiconductor chips formed by discretely dividing a semiconductor wafer and affixed to an adhesive sheet from said adhesive sheet comprising:

relatively moving said position of a fixing table and said position of a backup holder to set first to third thrust pin groups to a position corresponding to one of said semiconductor chips which is to be picked up;

separating corner portions of said semiconductor chip from said adhesive sheet by bending said semiconductor chip into a concave shape by use of said first thrust pin group, while keeping a nearby portion of a central portion of said semiconductor chip in position by use of said second thrust pin group by projecting said first and second thrust pin groups from said backup holder to thrust up said semiconductor chip with said adhesive sheet disposed therebetween while drawing a vacuum on the inside of said backup holder to hold said adhesive sheet by suction;

separating respective sides of said semiconductor chip by projecting said third thrust pin group from said backup holder to a position which is lower than that of said first and second thrust pin groups to thrust up said semiconductor chip with said adhesive sheet disposed therebetween while drawing a vacuum on the inside of said backup holder to hold said adhesive sheet by suction; and separating said nearby portion of said central portion of said semiconductor chip by use of said second thrust pin group.

40. A semiconductor device manufacturing method comprising:

forming elements on a main surface of a semiconductor wafer;

forming a plurality of semiconductor chips by discretely dividing said semiconductor wafer on which said elements have been formed along one of dicing lines and chip dividing lines;

affixing said plurality of discretely divided semiconductor chips to an adhesive sheet and fixedly setting said plurality of semiconductor chips on a fixing table;

moving said fixing table to set first and second thrust pin groups to a position corresponding to one of said semiconductor chips which is to be picked up;

separating corner portions of said semiconductor chip from said adhesive sheet by projecting said first thrust pin group from said backup holder to thrust up said semiconductor chip with said adhesive sheet disposed therebetween and thereby bend said semiconductor chip into a concave shape while drawing a vacuum on the inside of said backup holder to hold said adhesive sheet by suction;

separating a nearby portion of a central portion of said semiconductor chip from said adhesive sheet, while holding said nearby portion of said central portion of said semiconductor chip by said second thrust pin group, by projecting said second thrust pin group from said backup holder to a position which is lower than that of said first thrust pin group to thrust up said semiconductor chip with said adhesive sheet disposed therebetween while drawing a vacuum on the inside of said backup holder to hold said adhesive sheet by suction; and setting said pressure in said internal portion of said backup holder back to atmospheric pressure and holding and picking up said semiconductor chip by suction by use of a collet.

41. The semiconductor device manufacturing method according to claim 40, wherein a pin holder is selected and mounted according to at least one of the size and thickness of said semiconductor chip to be picked up after said fixing table is moved.

42. The semiconductor device manufacturing method according to claim 40, further comprising mounting semiconductor chips which are individually picked up after said pickup step.

43. The semiconductor device manufacturing method according to claim 40, further comprising packing semiconductor chips which are individually picked up into a tray after said pickup step.

44. A semiconductor device manufacturing method comprising:

forming elements on a main surface of a semiconductor wafer;

forming a plurality of semiconductor chips by discretely dividing said semiconductor wafer on which said elements have been formed along one of dicing lines and chip dividing lines;

affixing said plurality of discretely divided semiconductor chips to an adhesive sheet and fixedly setting said plurality of semiconductor chips on a fixing table;

moving said fixing table to set first and third thrust pin groups to a position corresponding to said semiconductor chip to be picked up;

separating corner portions of said semiconductor chip from said adhesive sheet by projecting said first thrust pin group from said backup holder to thrust up said semiconductor chip with said adhesive sheet disposed therebetween and thereby bend said semiconductor chip into a concave shape while drawing a vacuum on the inside of said backup holder to hold said adhesive sheet by suction;

keeping a nearby portion of a central portion of said semiconductor chip in position by projecting said second thrust pin group from said backup holder to a position which is lower than that of said first thrust pin group to thrust up said semiconductor chip with said adhesive sheet disposed therebetween while drawing a vacuum on the inside of said backup holder to hold said adhesive sheet by suction;

separating respective sides of said semiconductor chip by projecting said third thrust pin group from said backup holder to a position which is lower than that of said second thrust pin group to thrust up said semiconductor chip with said adhesive sheet disposed therebetween while drawing a vacuum on the inside of said backup holder to hold said adhesive sheet by suction;

separating said nearby portion of said central portion of said semiconductor chip by use of said second thrust pin group; and setting said pressure in said internal portion of said backup holder back to atmospheric pressure and holding and picking up said thus separated semiconductor chip by suction by use of a collet.

45. The semiconductor device manufacturing method according to claim 44, wherein a pin holder is selected and mounted according to at least one of the size and thickness of said semiconductor chip to be picked up after said fixing table is moved.

46. The semiconductor device manufacturing method according to claim 44, further comprising mounting semiconductor chips which are individually picked up after said pickup step.

47. The semiconductor device manufacturing method according to claim 44, further comprising packing semiconductor chips which are individually picked up into a tray after said pickup step.

48. A semiconductor device manufacturing method comprising:

forming elements on a main surface of a semiconductor wafer;

forming a plurality of semiconductor chips by discretely dividing said semiconductor wafer on which said elements have been formed along one of dicing lines and chip dividing lines;

affixing said plurality of discretely divided semiconductor chips to an adhesive sheet and fixedly setting said plurality of semiconductor chips on a fixing table;

moving said fixing table to set first and third thrust pin groups to a position corresponding to one of said semiconductor chips which is to be picked up;

separating corner portions of said semiconductor chip from said adhesive sheet by bending said semiconductor chip into a concave shape by use of said first thrust pin group, while keeping a nearby portion of a central portion of said semiconductor chip in position by use of said second thrust pin group by projecting said first and second thrust pin groups from said backup holder to thrust up said semiconductor chip with said adhesive sheet disposed therebetween while drawing a vacuum on the inside of said backup holder to hold said adhesive sheet by suction;

separating respective sides of said semiconductor chip by projecting said third thrust pin group from said backup holder to a position which is lower than that of said first and second thrust pin groups to thrust up said semiconductor chip with said adhesive sheet disposed therebetween while drawing a vacuum on the inside of said backup holder to hold said adhesive sheet by suction;

separating said nearby portion of said central portion of said semiconductor chip by use of said second thrust pin group; and setting said pressure in said internal portion of said backup holder back to atmospheric pressure and holding and picking up said semiconductor chip by suction by use of a collet.

49. The semiconductor device manufacturing method according to claim 48, wherein a pin holder is selected and mounted according to at least one of the size and thickness of said semiconductor chip to be picked up after said fixing table is moved.

50. The semiconductor device manufacturing method according to claim 48, further comprising mounting semiconductor chips which are individually picked up after said pickup step.

51. The semiconductor device manufacturing method according to claim 48, further comprising packing semiconductor chips which are individually picked up into a tray after said pickup step.

* * * * *